United States Patent
Ito et al.

(10) Patent No.: US 6,872,965 B2
(45) Date of Patent: Mar. 29, 2005

(54) GROUP III NITRIDE COMPOUND SEMICONDUCTOR DEVICE

(75) Inventors: Jun Ito, Inazawa (JP); Toshiaki Chiyo, Ama-gun (JP); Naoki Shibata, Bisai (JP); Hiroshi Watanabe, Ichinomiya (JP); Shizuyo Asami, Inazawa (JP); Shinya Asami, Inazawa (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/020,460

(22) Filed: Dec. 18, 2001

(65) Prior Publication Data

US 2003/0042505 A1 Mar. 6, 2003

Related U.S. Application Data

(62) Division of application No. 09/518,724, filed on Mar. 3, 2000, now Pat. No. 6,426,512.

(30) Foreign Application Priority Data

| Mar. 5, 1999 | (JP) | 11-058128 |
| Mar. 8, 1999 | (JP) | 11-060206 |
| Mar. 9, 1999 | (JP) | 11-061155 |
| Mar. 31, 1999 | (JP) | 11-090833 |
| Aug. 23, 1999 | (JP) | 11-235450 |

(51) Int. Cl.$^7$ .......................................... H01L 29/06
(52) U.S. Cl. .......................... 257/12; 257/13; 257/22; 257/97; 257/103
(58) Field of Search ...................... 257/12–14, 22, 257/94, 96, 97, 103, 763

(56) References Cited

U.S. PATENT DOCUMENTS 5,689,123 A * 11/1997 Major et al. ................ 257/190
5,786,606 A 7/1998 Nishio et al. ............... 257/103
6,028,877 A 2/2000 Kimura ....................... 372/46
6,426,512 B1 * 7/2002 Ito et al. ...................... 257/12

FOREIGN PATENT DOCUMENTS

| EP | 0781643 A2 | 7/1997 |
| EP | 0865088 A2 | 9/1998 |
| EP | A- 0 865 088 * | 9/1998 |
| JP | 9-51139 | 2/1997 |
| JP | 09094925 | 4/1997 |
| JP | 09094926 | 4/1997 |
| JP | 9-237938 | 9/1997 |
| JP | 10000652 | 1/1998 |
| JP | 10000653 | 1/1998 |
| JP | 10000654 | 1/1998 |
| JP | 10-321954 | 12/1998 |
| JP | 11-176758 | 7/1999 |
| JP | 11-195814 | 7/1999 |
| WO | WO 99/28977 | 6/1999 |

OTHER PUBLICATIONS

Patent Abstracts of Japan 02081482 dated Mar. 22, 1990 (JP66–232885).

Luther et al., "Titanium and titanium nitride contacts to n–type gallium nitride", Semicond. Sci. Technol. 13 (1998), pp. 1322–1327.

* cited by examiner

Primary Examiner—Sara Crane
(74) Attorney, Agent, or Firm—McGinn & Gibb, PLLC

(57) ABSTRACT

An undercoat layer inclusive of a metal nitride layer is formed on a substrate. Group III nitride compound semiconductor layers are formed on the undercoat layer continuously.

11 Claims, 26 Drawing Sheets

GROUP III NITRIDE COMPOUND SEMICONDUCTOR DEVICE

This is a Divisional of U.S. application Ser. No. 09/518,724, filed Mar. 3, 2000 now U.S. Pat. No. 6,426,512 the entire contents of which are incorporated by reference.

BACKGROUND OF THE INVENTION

1. Field of the Invention

This invention relates to a group III nitride compound semiconductor device. More particularly, it relates to an improvement in an undercoat layer for a group III nitride compound semiconductor layer such as a GaN semiconductor layer.

The present application is based on Japanese Patent Applications No. Hei. 11-58128, 11-60206, 11-611155, 11-90833, and 11-235450, which are incorporated herein by reference.

2. Description of the Related Art

The fact that a (111) face of metal nitride exhibiting an NaCl structure as an undercoat layer is used as a substrate to obtain a group III nitride compound semiconductor layer, such as a GaN semiconductor layer, of a good crystal has been disclosed in Japanese Patent Publication No. Hei. 9-237938. That is, in Japanese Patent Publication No. Hei. 9-237938, metal nitride exhibiting an NaCl structure is used as a substrate so that a group III nitride compound semiconductor layer is grown on a (111) face of the substrate.

A substrate for a semiconductor device needs certain characteristics such as stiffness, impact resistance, etc. for keeping to maintain the function of the device. It is thought that the substrate needs a thickness of 100 μm or larger in order to keep the characteristic when the substrate is formed of metal nitride.

Metal nitride having such a thickness, however, has not been provided as a raw material of an industrial product used for production of a semiconductor.

Therefore, when an invention described in Japanese Patent Publication No. Hei. 9-237938 is to be carried out, the substrate of metal nitride must be produced personally (probably by a sputtering, or the like) with a great deal of labor.

Incidentally, it is known that, among group III nitride compound semiconductors, a GaN semiconductor can be used for a blue light-emitting device. In such a light-emitting device, sapphire is generally used as a substrate.

One of the problems to be solved in the sapphire substrate is as follows. That is, the sapphire substrate is transparent, so that light of the light emitting device to be originally taken out from an upper face of the device passes through the sapphire substrate. Hence, light emitted from the light-emitting device cannot be used effectively.

Moreover, the sapphire substrate is expensive.

Moreover, the sapphire substrate is an electrical insulator, so that it is necessary to form electrodes on one face side. Hence, the semiconductor layer must be etched partially, so that a bonding process twice as long is required correspondingly. Further, because n-type and p-type electrodes are formed on one face side, reduction of the device size is limited. In addition, there is a "charge-up" problem.

On the other hand, substituting an Si (silicon) substrate for the sapphire substrate may be thought of. According to the inventors' examination, it was, however, very difficult to grow a GaN semiconductor layer on the Si substrate. On cause of the difficulty is the difference in thermal expansibility between Si and the GaN semiconductor. The linear expansion coefficient of Si is $4.7 \times 10^{-6}$/K whereas the linear expansion coefficient of GaN is $5.59 \times 10^{-6}$/K. The former is smaller than the latter. Accordingly, if heating is performed when the GaN semiconductor layer is grown, the device is deformed so that the Si substrate is expanded while the GaN semiconductor layer side is contracted relatively. On this occasion, tensile stress is generated in the GaN semiconductor layer, so that there is a risk of occurrence of cracking as a result. Even in the case where cracking does not occur, distortion occurs in the lattice. Hence, the GaN semiconductor device cannot fulfill its original function.

FIG. 26 shows an example of a group III nitride compound semiconductor device with a group III metal nitride semiconductor layer grown on a sapphire substrate. In a semiconductor device 1, all of a p-type layer 6 and a light-emitting layer 5 and part of an n-type layer 4 are removed by means of etching. Further, an n-type electrode 9 is connected to a revealed portion of the n-type layer 4. Incidentally, in FIG. 26, the reference numerals 2, 3, 7 and 8 designate a substrate, a buffer layer, a light-transmissible electrode and a p-type electrode respectively.

The inventors have examined the light-emitting device configured as described above. As a result, problems to be solved have been found as follows.

The thickness of the substrate 2 is about 100 μm, and the thickness of each of layers 3 to 7 is about 5 μm. On the contrary, size of the lateral direction of the semiconductor device 1 is about 350 μm. When the LED is put on the light, the current must be flowed in the lateral direction of the n-type layer 4. As a result, the distance of the electricity path increases and resistance is increased unavoidably. Further, the thickness of an n-type layer portion 4A touching the light-emitting layer 5 is different from the thickness of an n-type layer portion 4B which forms an n-electrode 9. Hence, current concentration occurs in the boundary between the thick portion 4A and the thin portion 4B. As a result, the operating voltage of the device becomes high. There is also a problem that withstand electrostatic stress characteristic is worsened because of the current concentration. Moreover, when the aforementioned configuration is applied to a general electronic device such as a rectifier, a thyristor, a transistor, an FET, or the like, the operating voltage of the device becomes high. Hence, there is a further problem that the permissible current cannot be set to be large.

SUMMARY OF THE INVENTION

An object of the present invention is to form a group III nitride compound semiconductor layer, especially, a GaN semiconductor layer, of a good crystal structure by using industrially available raw materials. As a result, a semiconductor device according to the present invention can be provided with a semiconductor layer of a good crystal structure and produced inexpensively.

From a different point of view, another object of the invention is to provide a novel-structure group III nitride compound semiconductor device and a method for producing the device.

That is, according to the present invention, there is provided a semiconductor device comprising a substrate, an undercoat layer formed on the substrate and containing metal nitride, and a group III nitride compound semiconductor layer formed on the undercoat layer. Such semiconductor device includes a light-emitting device, a photodetector, an electronic device, or the like.

The undercoat layer may be formed so as to contain at least one member selected from the group consisting of titanium nitride, zirconium nitride, hafnium nitride, and tantalum nitride.

The substrate can be formed of any one member selected from the group consisting of sapphire, silicon carbide, gallium nitride, silicon, gallium phosphide, and gallium arsenide.

A titanium layer may be further provided between the undercoat layer and the semiconductor layer.

A buffer layer of a group III nitride compound semiconductor may be further provided between the semiconductor layer and the undercoat layer.

Further, the undercoat layer may be constituted by a combination of a titanium layer formed on the substrate and a heat-resisting layer. In this case, the substrate is formed of silicon.

In the above description, the titanium layer and heat-resisting layer may be repeatedly alternately laminated one on another.

An electrode can be further provided on the undercoat layer.

In the semiconductor light-emitting device configured as described above according to the present invention, a GaN light-emitting layer is formed on the undercoat layer of metal nitride formed on the substrate. The GaN light-emitting layer of a good crystal can be grown on the undercoat layer because the lattice mismatch between the undercoat layer and the light-emitting layer formed on the undercoat layer can be reduced by adjustment of the composition of metal nitride. On the other hand, the thickness of the undercoat layer can be reduced because the substrate can have a thickness required for holding the function of the device. Hence, the undercoat layer can be formed easily and inexpensively. If a general substrate such as a sapphire substrate is used as the substrate, the device can be produced inexpensively as a whole.

Moreover, in the configuration of the present invention, a reflection layer of metal nitride may be provided just under the light-emitting layer. Light emitted from the light-emitting layer toward the substrate is reflected by the reflection layer because the reflection layer has a gloss of metallic color so that the reflection layer reflects visible light. Further, the substantial whole of the light toward the substrate is reflected by the reflection layer because the reflection layer is disposed just under the light-emitting layer. As a result, the substantial whole of the light emitted from the light-emitting layer toward the substrate can be utilized effectively, so that improvement of the brightness of the light-emitting device can be attained.

Features and advantages of the invention will be evident from the following detailed description of the preferred embodiments described in conjunction with the attached drawings.

DETAILED DESCRIPTION OF THE PREFERRED EMBODIMENTS

Figure 1:
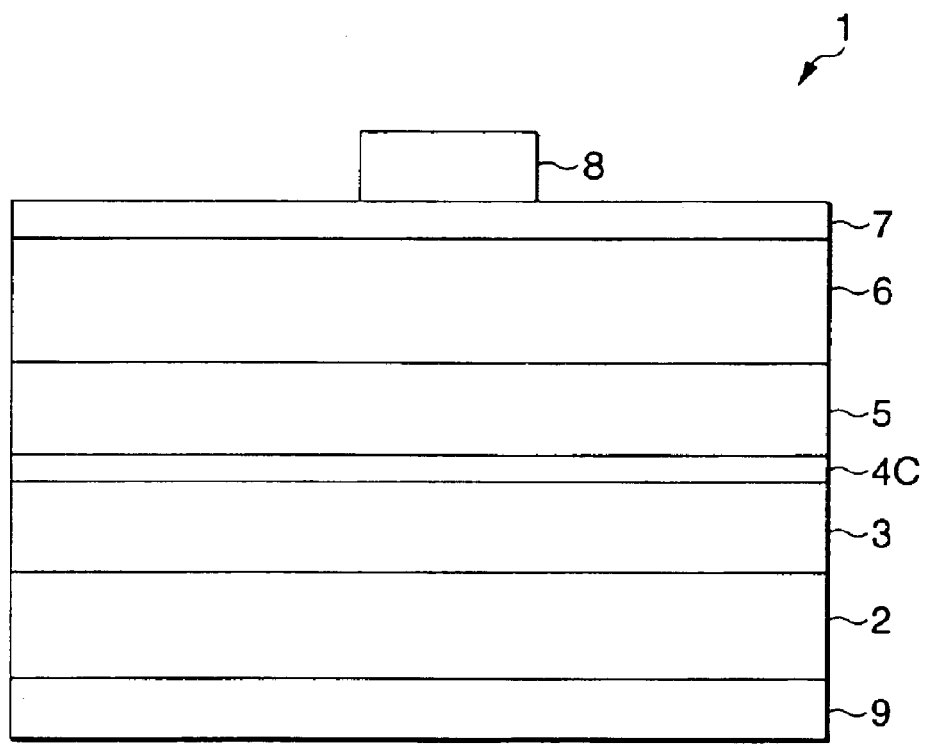
FIG. 1 is a view showing a light-emitting diode 1 as a first embodiment of the present invention.

Respective constituent members of the present invention will be described below.

A GaN semiconductor is a group III metal nitride semiconductor, which is generally represented by $Al_X Ga In_{1-X-Y} N$ ($0 \leq X \leq 1$, $0 \leq Y \leq 1$, $X+Y \leq 1$). A layer of such a GaN semiconductor is grown by a known metal organic chemical vapor deposition method (hereinafter abbreviated as MOCVD method). Alternatively, this layer may be grown by a known molecular beam epitaxy method (hereinafter abbreviated as MBE method), or the like.

A hexagonal crystal material such as sapphire, SiC, or the like, or a cubic crystal material such as Si, GaP, or the like, can be used as a substrate. In the case of a hexagonal crystal material, a face c thereof is used.

When SiC, Si or GaP is used as a substrate, each of the substrate and the metal nitride has electrically conducting characteristic. As a result, electrodes can be formed at opposite ends of a semiconductor light-emitting device, so that the "charge-up" problem can be solved easily.

This substrate needs characteristic (stiffness, impact resistance, etc.) for holding the function of the device. Hence, the substrate needs to be not thinner than about 100 μm.

The undercoat layer is formed of metal nitride. The metal nitride is not particularly limited to a specific kind but nitride of Ti, Zr, Hf or Ta can be preferably used as the metal nitride. NbN, VN, YN, CrN, or the like, may be used also as the metal nitride.

When these metal nitride compounds are used singly, lattice mismatch occurs. For example, TiN makes a lattice mismatch of 6% for GaN and a lattice mismatch of 3.5% for AlN, and similarly ZrN makes a lattice mismatch of 1.5% for GaN and a lattice mismatch of 3.9% for AlN. Therefore, nitride of an alloy formed of these metals is preferably used so that the undercoat layer of metal nitride makes a lattice match for the light-emitting layer of metal nitride.

The method for growing the undercoat layer is not particularly limited but CVD (Chemical Vapor Deposition) such as plasma CVD, thermal CVD, optical CVD, etc., PVD (Physical Vapor Deposition) such as sputtering, reactive sputtering, laser ablation, ion plating, evaporation, etc., or the like, may be used as the method.

The thickness of the undercoat layer is preferably set to be in a range of from 0.1 to 10 μm.

The undercoat layer may be grown through an appropriate buffer layer on the substrate. The buffer layer may be a single layer or a laminate formed of a plurality of buffer layers.

Alternatively, a layer of a metal such as Ti, or the like, may be laminated on the aforementioned metal nitride to thereby form a Ti/metal nitride laminate as the undercoat layer.

Alternatively, the undercoat layer may be formed by means of repeating a laminate of metal nitride and a layer of a metal such as Ti, or the like. In this case, preferably, the uppermost layer is formed of metal nitride.

The light-emitting layer is formed on the undercoat layer continuously. That is, the undercoat layer of metal nitride is disposed just under the light-emitting layer. Hence, the substantial whole of light emitted from the light-emitting layer toward the substrate is reflected by the undercoat layer. As a result, the light emitted from the light-emitting layer toward the substrate can be utilized effectively, so that improvement of the brightness of the light-emitting device can be attained.

A clad layer is formed on the light-emitting layer by a known method. After an necessary etching process, n-type and p-type electrodes are formed.

(First Embodiment)

A first embodiment of this invention will be described below with reference to the drawings.

FIG. 1 shows a light-emitting diode 1 according to this embodiment. Specifications of respective semiconductor layers are as follows.

| Layer | Composition | Dopant | (Thickness) |
|---|---|---|---|
| p-type clad layer 6 | p-GaN | Mg | (0.3 μm) |
| light-emitting layer 5 | Superlattice structure | | |

-continued

| Layer | Composition | Dopant | (Thickness) |
|---|---|---|---|
| quantum well layer | $In_{0.15}Ga_{0.85}N$ | | (35 Å) |
| barrier layer | GaN | | (35 Å) |
| the number of repeated quantum well and barrier layers: 1 to 10 | | | |
| reflection layer 4C | $Ti_{0.268}Zr_{0.732}N$ | | (3000 Å) |
| buffer layer 3 | Al | | (100 Å) |
| substrate 2 | Silicon (111) | | (300 μm) |

The buffer layer 3 is laminated on the substrate 2 by an MOVPE method.

The reflection layer 4C is formed by a reactive sputtering method. Incidentally, in this embodiment, the reflection layer 4C serves also as an undercoat layer.

The light-emitting layer 5 is not limited to the superlattice structure but the light-emitting layer 5 may be of a single hetero type, a double hetero type, a homo-junction type, or the like.

An $Al_XGa_YIn_{1-X-Y}N$ ($0 \leq X \leq 1$, $0 \leq Y \leq 1$, $X+Y \leq 1$) layer, which has a wide band gap and which is doped with an acceptor such as magnesium, or the like, may be interposed between the light-emitting layer 5 and the p-type clad layer 6. This technique is employed for preventing electrons implanted into the light-emitting layer 6 from being diffused into the p-type clad layer 6.

The p-type clad layer 6 may be of a double-layered structure with a p⁻ layer of a low Mg density on the light-emitting layer 5 side and a p⁺ layer of a high Mg density on the p-type electrode 8 side.

The respective semiconductor layers are formed by means of a known MOCVD method. In this growth method, an ammonia gas and gases of group III metal alkyl compounds such as trimethylgallium (TAG), trimethylaluminum (TMA) and trimethylindium (TMI) are supplied onto a substrate heated to an appropriate temperature and are subjected to a thermal decomposition reaction to thereby grow a desired crystal on the substrate.

A light-transmissible electrode 7, which is constituted by a thin film containing gold, is laminated to cover the substantially whole area of an upper face of the p-type clad layer 6. A p-type electrode 8, which is constituted also by a material containing gold, is formed on the light-transmissible electrode 7 by means of evaporation.

Incidentally, an n-type electrode 9 is formed on the Si substrate layer 2 and bonded to a desired position.

This invention is not limited to the aforementioned description of the mode for carrying out the invention and the embodiments thereof at all, and includes various modifications that can be conceived by those skilled in the art without departing from the scope of claim for a patent.

That is, the substrate is formed of a hexagonal crystal material or a cubic crystal material. The undercoat layer may be formed on the substrate of the hexagonal crystal material or may be formed on a (111) face of the cubic crystal material.

Sapphire or silicon carbide may be used as the hexagonal crystal material. Silicon or gallium phosphide may be used as the cubic crystal material.

The metal nitride may contain at least one member selected from the group consisting of nitrides of Ti, Zr, Hf and Ta, and nitrides of alloys of these metals.

The inventors of the present application have made further examination eagerly to achieve at least one of the foregoing objects. As a result, the following invention has been conceived.

That is, a group III nitride compound semiconductor device comprising:

a substrate;

an undercoat layer formed on the substrate and containing at least one member selected from the group consisting of titanium nitride, hafnium nitride, zirconium nitride, and tantalum nitride; and a group III nitride compound semiconductor layer formed on the undercoat layer.

In the semiconductor device configured as described above according to the present invention, the undercoat layer of titanium nitride, hafnium nitride, zirconium nitride or tantalum nitride is formed on the substrate. The lattice mismatch between the undercoat layer of such metal nitride and the group III nitride compound semiconductor layer formed on the undercoat layer is reduced extremely. Hence, the group III nitride compound semiconductor layer of a good crystal can be grown on the undercoat layer. If a general substrate such as a sapphire substrate is used as the substrate, the device can be produced inexpensively as a whole.

In the above description, a hexagonal crystal material such as SiC (silicon carbide), GaN (gallium nitride), etc. or a cubic crystal material such as Si (silicon), GaP (gallium phosphide), GaAs (gallium arsenide), etc. can be used as the substrate. In the case of a hexagonal crystal material, the undercoat layer is grown on the hexagonal crystal material. In the case of a cubic crystal material, a (111) face of the cubic crystal material is used.

When SiC, GaN, silicon, GaP or GaAs is used as the substrate, electrically conducting characteristic can be given to the substrate. Further, each of titanium nitride (TiN), hafnium nitride, zirconium nitride and tantalum nitride has electrically conducting characteristic. As a result, electrodes can be formed at opposite faces of the semiconductor device, so that the number of device process steps can be reduced to attain reduction of cost.

When an LED is produced by using sapphire as a substrate, metal nitride has a metallic gloss. Hence, light emitted from the LED is reflected by titanium nitride, hafnium nitride, zirconium nitride, etc., so that it is expected that brightness is improved.

This substrate needs characteristic (stiffness, impact resistance) for holding the function of the device. Therefore, the thickness of the substrate is set to substantially not less than 100 μm. Incidentally, the substrate may be thin if the stiffness of the substrate can be kept.

Among metal nitride compounds, titanium nitride, hafnium nitride, zirconium nitride or tantalum nitride is selected as the undercoat layer. The method for growing these metal nitride compounds on a predetermined face of the substrate is not particularly limited but CVD (Chemical Vapor Deposition) such as plasma CVD, thermal CVD, optical CVD, etc., PVD (Physical Vapor Deposition) such as sputtering, reactive sputtering, laser ablation, ion plating, evaporation, ECR, etc., or the like, may be used as this method.

The thickness of the undercoat layer is preferably set to be in a range of from 50 Å to 10 μm.

Another layer may be interposed between the undercoat layer and the substrate. According to the inventors' examination, an Al layer is preferably interposed between a (111) face of silicon and a titanium nitride layer when titanium nitride is grown on the (111) face of silicon used as a substrate. The thickness of the Al layer is not particularly limited but set to be about 100 Å. Also the method for forming the Al layer is not particularly limited but, for example, the Al layer is formed by means of evaporation or sputtering.

After the undercoat layer is formed on the substrate, the substrate is preferably heated.

Figure 2:
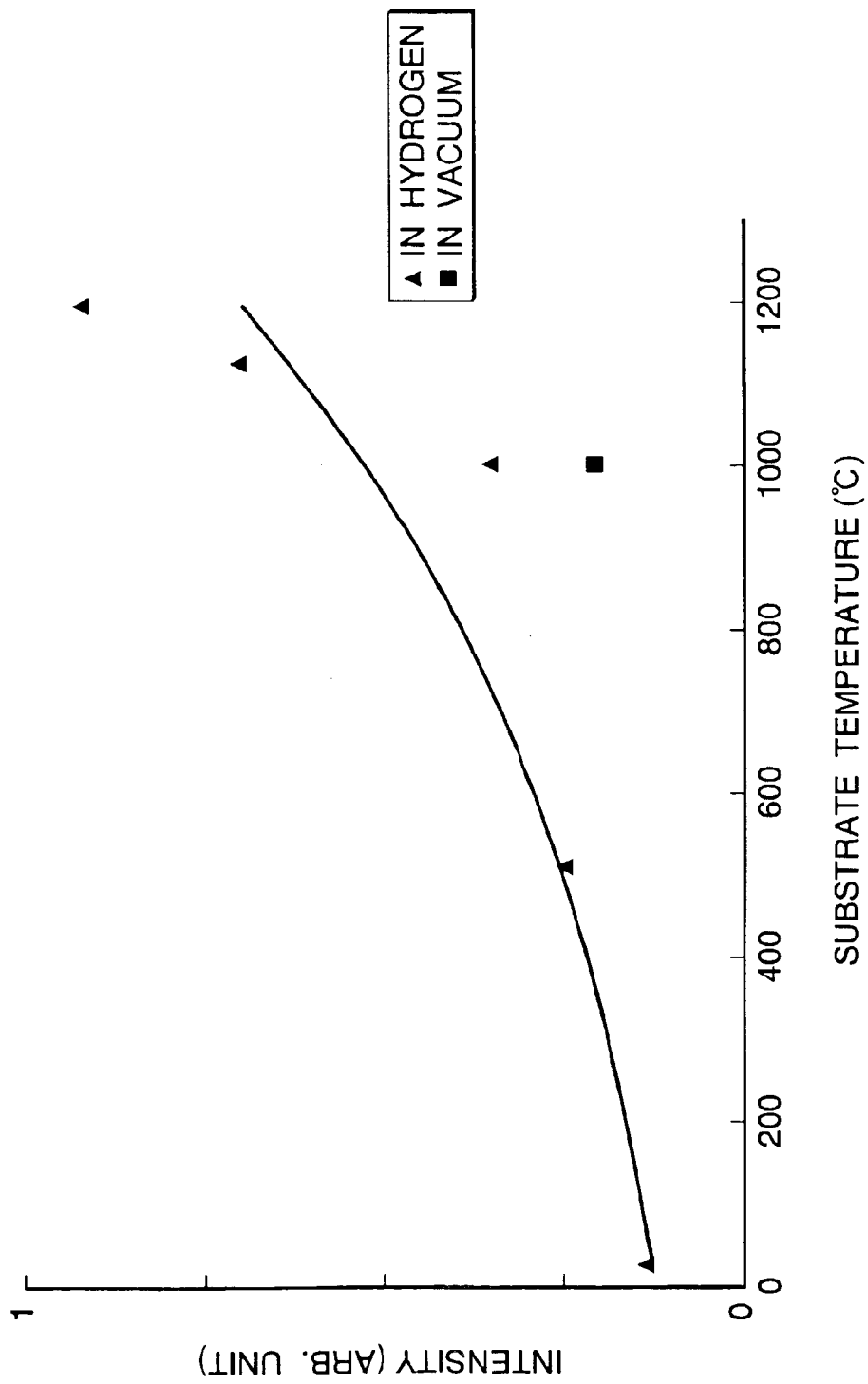
FIG. 2 is a graph showing the relation between the substrate temperature for a TiN layer and the peak intensity of $\phi$(PHI) scanning.

FIG. 2 shows a result of X-ray diffraction (φ(PHI) scanning) versus to the temperature for heating in the case where a sapphire substrate is heated after titanium nitride (thickness: about 3000 Å) is formed on a face a of the sapphire substrate by a reactive sputtering method. The heating time is 5 minutes. A quadraxial single crystal diffraction meter (product name: X-pert) made by Philips Corp. was used as an X-ray diffraction system (the same system will be applied to the following results of φ(PHI) scanning and X-ray rocking curve). See Journal of Electronic Materials, Vol. 25, No. 11, pp. 1740–1747, 1996, concerning φ(PHI) scanning. In φ(PHI) scanning, peaks corresponding to crystal faces are obtained when a sample is rotated by 360 degrees. In FIG. 2, the vertical axis shows the average value of the peak intensity of TiN layer (relative values). Because samples in which thicknesses of TiN layers are made uniform are used for measurement, it is thought of that the larger the intensity is, the better crystal is obtained. It is thought of that the crystallinity of the group III nitride compound semiconductor layer grown on the undercoat layer becomes better as the crystallinity of titanium nitride of the undercoat layer becomes better.

Figure 3:
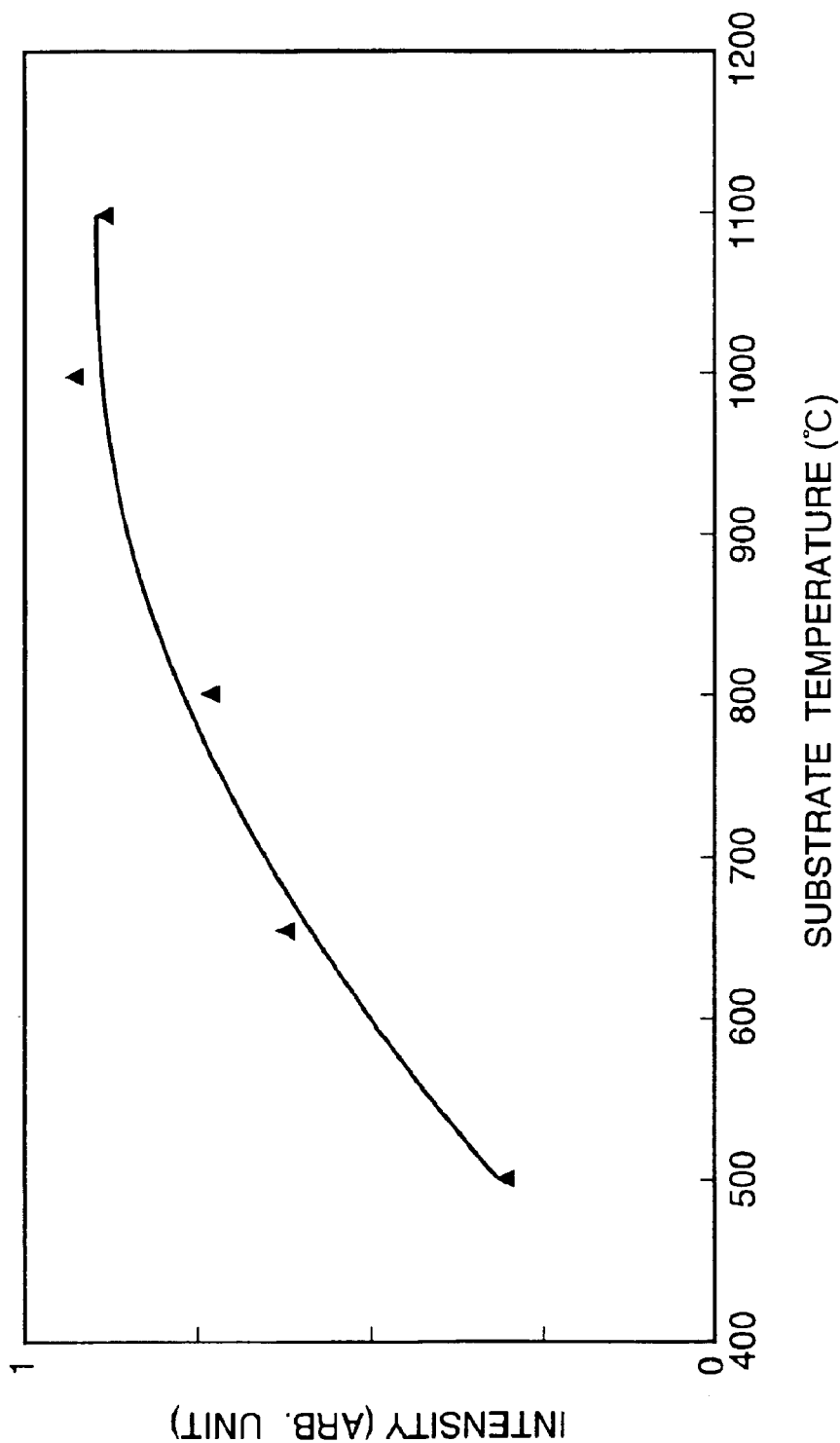
FIG. 3 is a graph showing the relation between the substrate temperature for a TiN layer formed on a sapphire substrate and the peak intensity of $\phi$(PHI) scanning of a GaN crystal grown on the TiN layer.

FIG. 3 shows a result of φ(PHI) scanning of a GaN layer which is formed on a titanium nitride undercoat layer by an MOCVD method after titanium nitride grown in the same condition as described above is heated (for 5 minutes) in an atmosphere of hydrogen.

It is preferable from the results shown in FIGS. 2 and 3 that the temperature for heating the undercoat layer is set to be in a range of from 600 to 1200° C. It is thought of that such heating improves the crystallinity of the undercoat layer more greatly. More preferably, the temperature for heating is in a range of from 800 to 1200° C.

It is preferable from the result shown in FIG. 2 that the undercoat layer is heated in an atmosphere of hydrogen or in a vacuum. More preferably, it is heated in an atmosphere of hydrogen.

Figure 4:
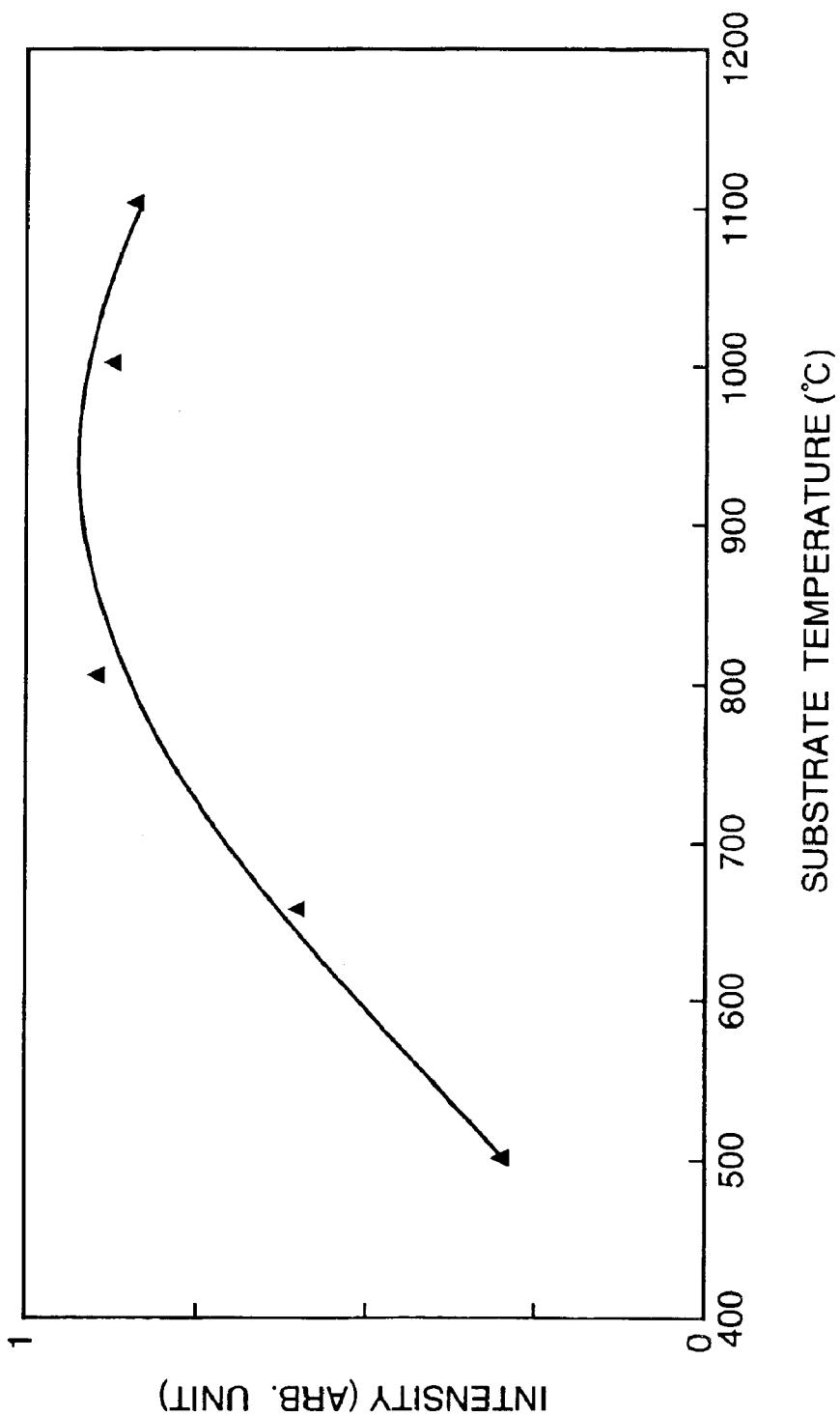
FIG. 4 is a graph showing the relation between the substrate temperature for a TiN layer formed through Al on an Si (111) substrate and the peak intensity of $\phi$(PHI) scanning of a GaN crystal.

A titanium nitride layer (thickness: about 3000 Å, growth method: reactive sputtering method) is formed through an Al layer (thickness: about 100 Å) on a (111) face of a silicon substrate. Then, a GaN layer is formed on the titanium nitride layer in the same manner as in FIG. 2. FIG. 4 shows a result of φ(PHI) scanning of this GaN layer.

It is apparent from the result shown in FIG. 4 that the temperature for heating is set to be preferably in a range of from 600 to 1200° C., more preferably in a range of from 800 to 1200° C.

The group III nitride compound semiconductor is represented by the general formula $Al_xGa_yIn_{1-X-Y}N$ ($0 \leq X \leq 1$, $0 \leq Y \leq 1$, $0 \leq X+Y \leq 1$), which may further contain group III elements such as boron (B) and thallium (Tl) and in which the nitrogen (N) may be partially replaced by phosphorus (P), arsenic (As), antimony (Sb) or bismuth (Bi). The group III nitride compound semiconductor may contain an optional dopant.

As is commonly known, a light-emitting device or a photodetector is configured so that different electrically conductive types of group III nitride compound semiconductor layers are laminated. A superlattice structure, a double heterostructure, or the like, is applied thereto. An electronic device represented by an FET structure can be also formed from group III nitride compound semiconductors. In this manner, the plurality of group III nitride compound semiconductor layers formed on the undercoat layer act on one another to fulfil a desired function.

For example, a titanium layer may be interposed between the undercoat layer and the group III nitride compound semiconductor layer according to the present invention. According to the inventors' examination referred in Japanese Patent Publication No. Hei. 11-195814 which is incorporated herein by reference, it has been found that the crystal structure of the group III nitride compound semiconductor layer formed on the titanium layer becomes good. The thickness of the titanium layer and the method for forming the titanium layer are not particularly limited.

A buffer layer may be preferably formed between the undercoat layer of metal nitride and the group III nitride compound semiconductor layer (of a second group III nitride compound semiconductor) constituting the device function portion. The buffer layer is formed of a first group III nitride compound semiconductor. The concept "first group III nitride compound semiconductor" used here includes quaternary compound semiconductors represented by $Al_XGa_YIn_{1-X-Y}N$ (0<X<1, 0<Y<1, 0<X+Y<1), ternary compound semiconductors represented by $Al_XGa_{1-X}N$ (0<X<1), $Al_XIn_{1-X}N$ (0<X<1), $Ga_XIn_{1-X}N$ (0<X<1), and binary compound semiconductors AlN, GaN and InN.

Figure 5:
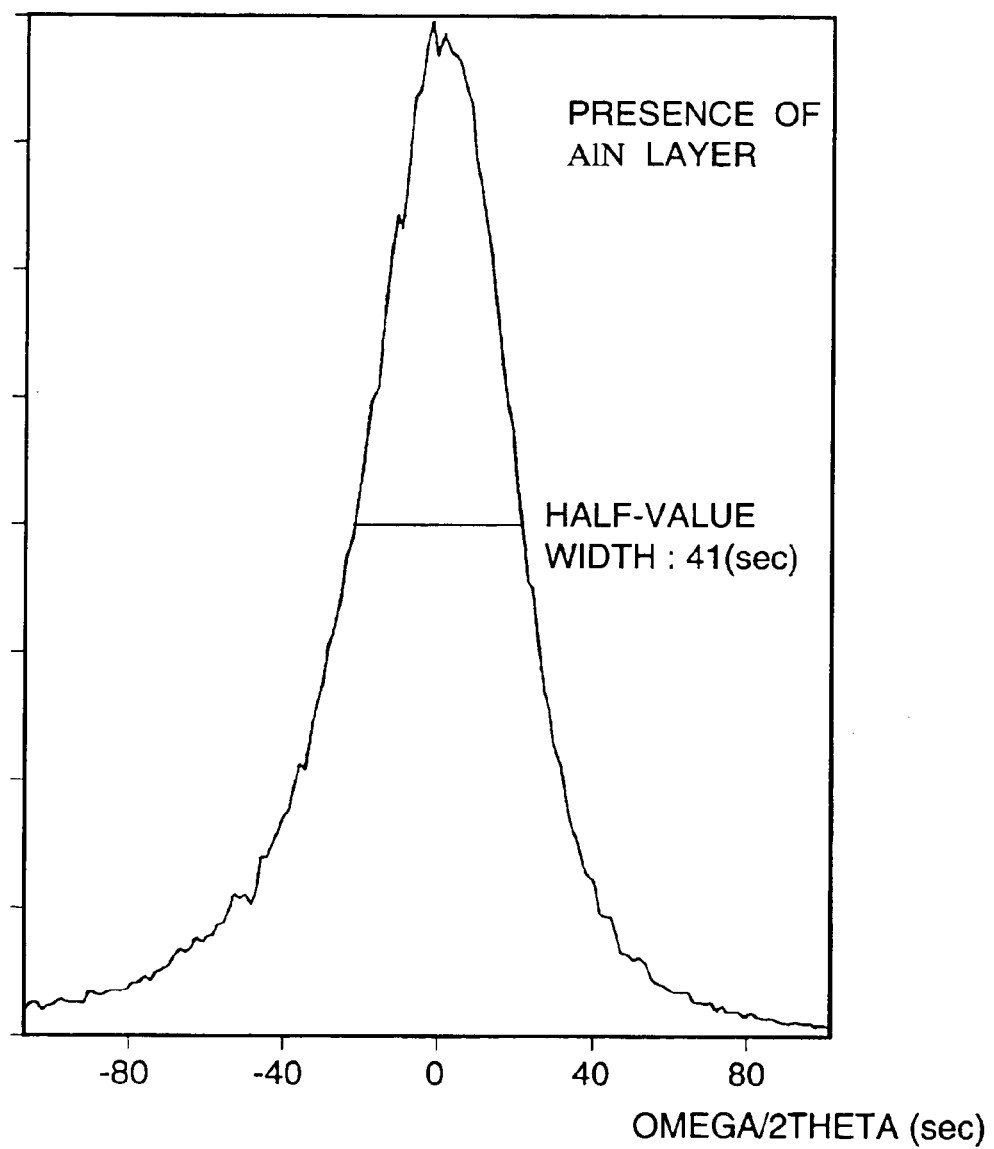
FIG. 5 shows an X-ray rocking curve of a GaN crystal on a buffer layer after the buffer layer is formed on TiN.
Figure 6:
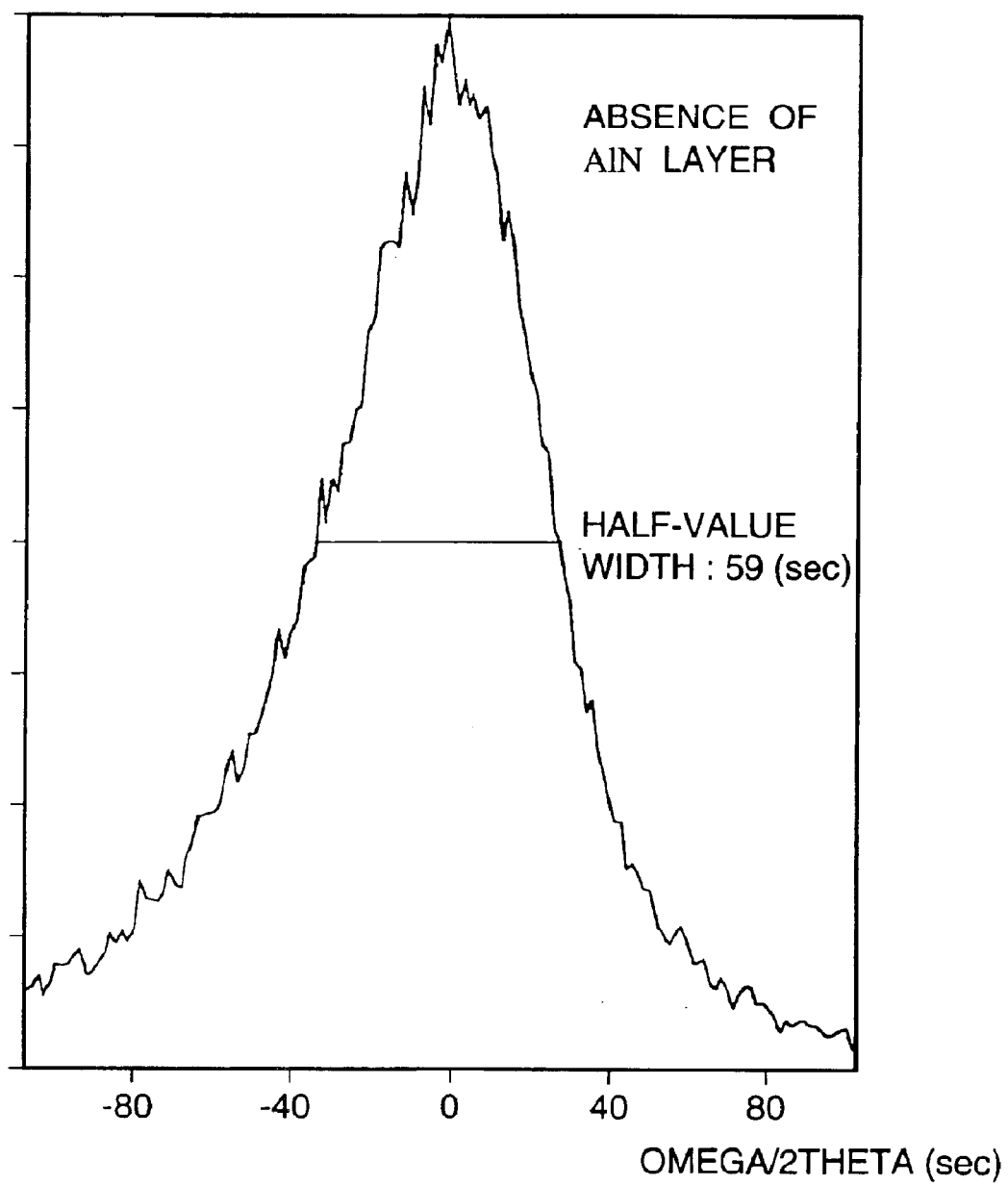
FIG. 6 shows an X-ray rocking curve of a GaN crystal in the case where the GaN crystal is grown on TiN directly.

When GaN is to be grown on metal nitride, a GaN crystal can be grown even in the case where there is no buffer layer but a better GaN crystal can be provided in the case where there is a buffer layer (see FIGS. 5 and 6).

Incidentally, FIG. 5 shows an X-ray rocking curve of a GaN crystal in the case where a buffer layer of AlN (thickness: 600 Å, growth temperature: 1000° C.) and a GaN layer (thickness: 1 μm, growth temperature: 1000° C.) are formed successively on an undercoat layer of titanium nitride (thickness: 3000 Å, substrate: sapphire) by an MOCVD method. On the other hand, FIG. 6 shows an X-ray rocking curve of a GaN crystal in the case where a GaN layer is formed in the aforementioned manner without formation of any buffer layer of AlN.

Figure 7:
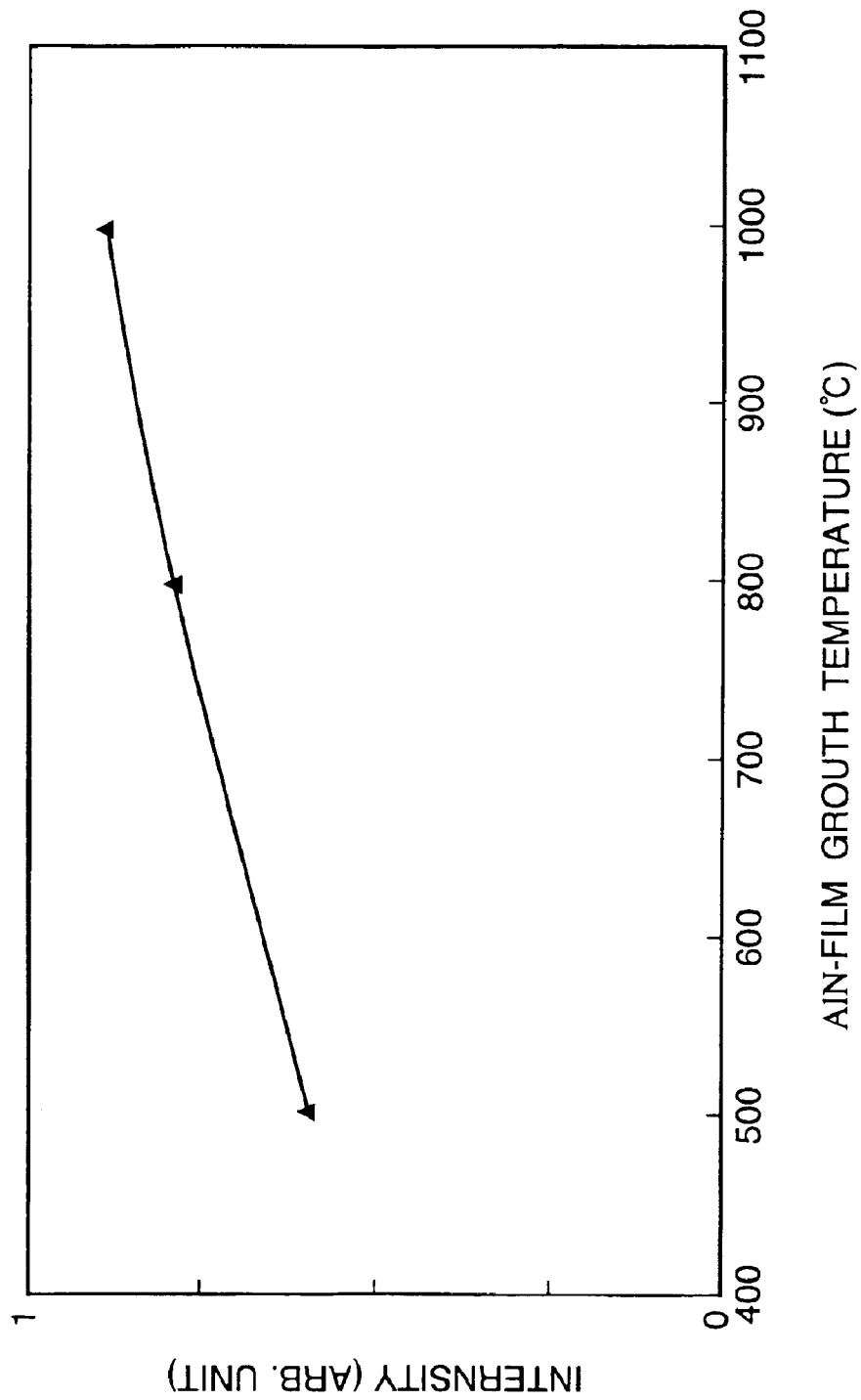
FIG. 7 is a graph showing the relation between the temperature for the growth of a buffer layer on TiN and the peak intensity of $\phi$(PHI) scanning of a GaN crystal on the buffer layer.

FIG. 7 shows the relation between the crystallinity (vertical axis: X-ray diffraction intensity (average value of PHI scanning)) of a GaN layer (thickness: 1 μm, growth temperature: 1000° C.) formed on a buffer layer of AlN (thickness: 600 Å) and the temperature for the growth of the buffer layer in the case where the buffer layer is formed on an undercoat layer of titanium nitride (thickness: 3000 Å, substrate: sapphire) by an MOCVD method while the temperature for the growth of the buffer layer is changed.

It is apparent from FIG. 7 that a more excellent result is obtained as the growth temperature for forming the buffer layer by means of the MOCVD method becomes higher (FIG. 7).

In a general MOCVD method, the first group III nitride compound semiconductor layer (buffer layer) of AlN, GaN, or the like, was formed directly on a substrate of sapphire, or the like, at a low temperature of about 400° C. When an undercoat layer of metal nitride is formed on the substrate, a better crystal can be, however, obtained by means of growing the first group III nitride compound semiconductor at a high temperature of about 1000° C. Hence, the crystallinity of the second group III nitride compound semiconductor layer formed on the buffer layer of good crystallinity is also improved.

The temperature of about 1000° C. is substantially equal to the temperature for the growth of the second group III nitride compound semiconductor layer (device function constituting layer) formed on the first group III nitride compound semiconductor layer (buffer layer). Hence, the growth temperature for forming the first group III nitride compound semiconductor by means of the MOCVD method is set to be preferably in a range of from 600 to 1200° C., more preferably in a range of from 800 to 1200° C.

When the temperature for the growth of the first group III nitride compound semiconductor layer (buffer layer) is equal to the temperature for the growth of the second group III nitride compound semiconductor layer (device function constituting layer) as described above, temperature control for executing the MOCVD method is made easily.

Also in the case where the buffer layer constituted by the first group III nitride compound semiconductor layer is formed on the undercoat layer by a sputtering method, the crystallinity of the obtained buffer layer is equal to or more excellent than that in the case where the buffer layer is formed by an MOCVD method. Hence, the crystallinity of the second group III nitride compound semiconductor layer formed on the first group III nitride compound semiconductor layer is also improved (see FIG. 8). Moreover, when the first group III nitride compound semiconductor layer (buffer layer) is formed by a sputtering method, expensive metal organic compounds such as TMA, TMI, etc. need not be used as raw materials compared with the MOCVD method. Hence, the device can be formed inexpensively.

Samples for evaluating improvement in crystallinity of the first group III nitride compound semiconductor and the second group III nitride compound semiconductor formed thereon as described in the above paragraph will be described below.

Sample 1

An undercoat layer of titanium nitride (thickness: 3000 Å) was formed on a sapphire substrate by a reactive DC magnetron spattering method while using titanium as a target and introducing a nitrogen gas. Then, the target was exchanged to aluminum and a reactive DC magnetron sputtering method was executed to thereby form a buffer layer of AlN (thickness: 600 Å).

From the result of φ(PHI) scanning in measurement by an X-ray diffraction system adjusted to a (200) face of the undercoat layer (titanium nitride) and the result of φ(PHI) scanning of a (10–12) face of the buffer layer (AlN), six symmetrical peaks were confirmed in each scanning. Hence, TiN and AlN films having crystallinity of a single crystal or near to a single crystal were formed.

If this statement is amplified, a first group III nitride compound semiconductor layer formed, by a sputtering method, on an undercoat layer containing at least one member selected from the group consisting of metal nitride compounds, that is, titanium nitride, zirconium nitride, hafnium nitride, and tantalum nitride has good crystallinity sufficiently to grow a second group III nitride compound semiconductor constituting the device function portion on the first group III nitride compound semiconductor layer.

Evaluation in the case where a silicon substrate was used was made in the same manner as described above. The evaluation will be described below.

Sample 2

An Al layer (100 Å) was formed on a silicon substrate by means of evaporation. Then, an undercoat layer of titanium nitride (thickness: 3000 Å) was formed on the Al layer by a reactive DC magnetron sputtering method while using titanium as a target and introducing a nitrogen gas. Then, the target was exchanged to aluminum and a reactive DC magnetron sputtering method was executed to thereby form a buffer layer of AlN (thickness: 600 Å).

From the result of φ(PHI) scanning of a (200) face of the undercoat layer (titanium nitride) in this sample and the result of φ(PHI) scanning of a (10–12) face of the buffer layer (AlN) in this sample, six symmetrical peaks were confirmed in each scanning. Hence, it was apparent that the crystal of each of titanium nitride and the buffer layer of AlN was a single crystal or a crystal near to the single crystal oriented to an axis c.

If this statement is amplified, a first group III nitride compound semiconductor layer formed, by a sputtering method, on an undercoat layer containing at least one member selected from the group consisting of metal nitride compounds, that is, titanium nitride, zirconium nitride, hafnium nitride, and tantalum nitride has good crystallinity sufficiently to grow a second group III nitride compound semiconductor constituting the device function portion on the first group III nitride compound semiconductor layer.

It is further apparent from these results that the quality of the substrate material is insignificant.

Figure 8:
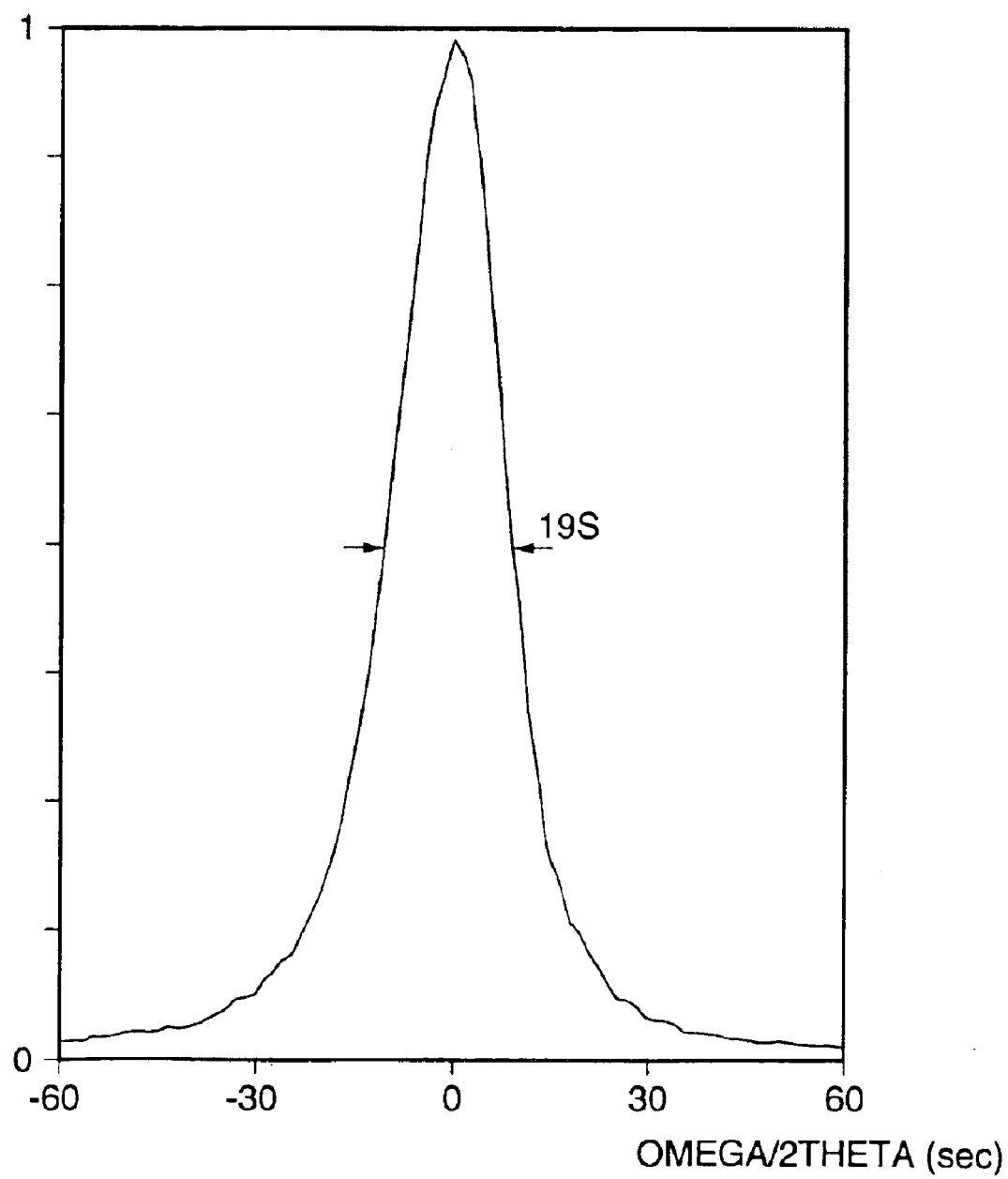
FIG. 8 shows an X-ray rocking curve of a GaN layer formed on an AlN layer of an sample 1 by an MOCVD method.

FIG. 8 shows an X-ray rocking curve of an GaN layer in the case where the GaN layer (thickness: 2.5 μm) is further formed on the sample 1 by an MOCVD method (growth temperature: 1100° C.). The half-value width of the rocking curve is 19 s. Hence, it is apparent that the quality of the GaN layer is high.

In the sample 1, the GaN layer was formed on the AlN layer in the aforementioned condition while changing the thicknesses of the titanium nitride and AlN layers. The X-ray rocking curve of the GaN layer was measured. The following table shows a result thereof.

GaN X-ray Rocking Curve

| | | AlN Film Thickness Å | | | | |
|---|---|---|---|---|---|---|
| | 600 | 800 | 1000 | 1200 | 1500 | 2000 |
| TiN Film Thickness Å 1500 | | 19s | 18s | 22s | | |
| 3000 | 19s | 21s | 21s | 22s | 21s | 23s |

From the result shown in the above, the GaN layer of good crystallinity was obtained regardless of the thicknesses of the titanium nitride and AlN layers.

If this statement is amplified, a second group III nitride compound semiconductor (device function portion) with good crystallinity can be grown on a first group III nitride compound semiconductor layer (buffer layer) regardless of the thicknesses of undercoat and buffer layers in the case where the first group III nitride compound semiconductor layer (buffer layer) is formed on an undercoat layer containing at least one member selected from the group consisting of metal nitride compounds, that is, titanium nitride, zirconium nitride, hafnium nitride, and tantalum nitride by an MOCVD method (growth temperature: 600 to 1200° C. or equal to the temperature for the growth of the second group III nitride compound semiconductor) or by a sputtering method.

(Second Embodiment)

A second embodiment of this invention will be described below.

Figure 9:
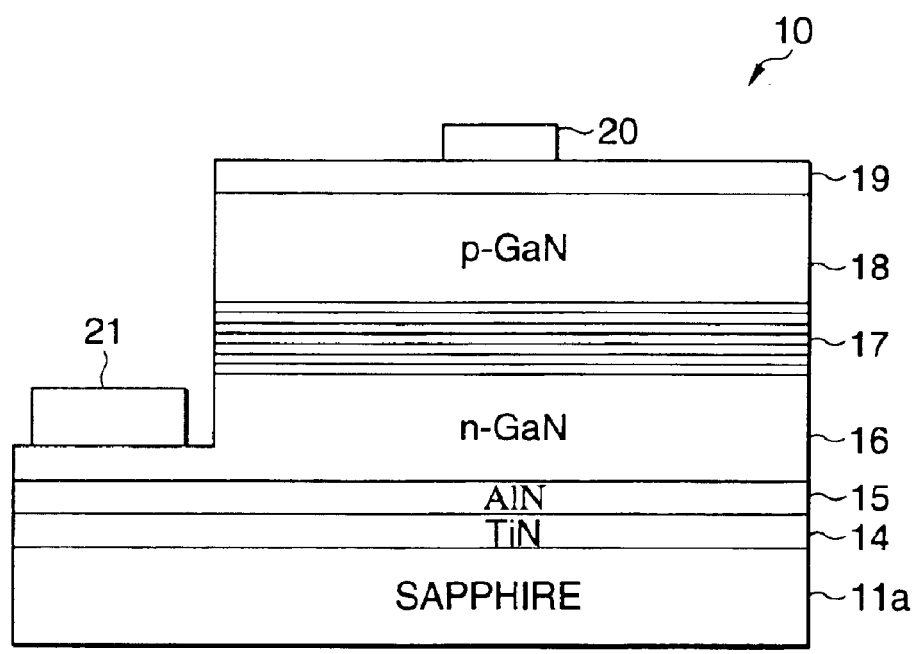
FIG. 9 is a view showing the configuration of a light-emitting diode as a second embodiment of the present invention.

This embodiment shows a light-emitting diode 10. FIG. 9 shows the configuration of the light-emitting diode 10.

Specifications of respective layers are as follows.

| Layer | Composition | Dopant | (Thickness) |
|---|---|---|---|
| p-type clad layer 18 | p-GaN | Mg | (0.3 μm) |
| light-emitting layer 17 | superlattice structure | | |

-continued

| Layer | Composition | Dopant | (Thickness) |
|---|---|---|---|
| quantum well layer | $In_{0.15}Ga_{0.85}N$ | | (35 Å) |
| barrier layer | GaN | | (35 Å) |
| the number of repeated quantum well and barrier layers: 1 to 10 | | | |
| n-type clad layer 16 | n-GaN | Si | (4 μm) |
| buffer layer 15 | AlN | | (600 Å) |
| TiN layer 14 | TiN single crystal | | (3000 Å) |
| substrate 11a | sapphire | | (300 μm) |

The n-type clad layer 16 may be of a double-layered structure with an n⁻ layer of a low electron density on the light-emitting layer 17 side and an n+layer of a high electron density on the buffer layer 15 side.

The light-emitting layer 17 is not limited to the superlattice structure. A single hetero type, a double hetero type, a homo-junction type, or the like, can be used as the configuration of the light-emitting device.

An $Al_xIn_yGa_{1-x-y}N$ (inclusive of X=0, Y=0, X=Y=0) layer, which has a wide band gap and which is doped with an acceptor such as magnesium, or the like, may be interposed between the light-emitting layer 17 and the p-type clad layer 18. This technique is used for preventing electrons implanted into the light-emitting layer 17 from being diffused into the p-type clad layer 18.

The p-type clad layer 18 may be of a double-layered structure with a p⁻ layer of a low hole density on the light-emitting layer 17 side and a p⁺ layer of a high hole density on the electrode side.

The TiN layer 14 is formed on a face a of the sapphire substrate by a reactive DC magnetron sputtering method. Further, the target is exchanged to Al and an AlN layer is formed by a reactive DC magnetron sputtering method.

Then, the AlN/TiN/sapphire sample is transferred from a spattering apparatus into a chamber of an MOCVD apparatus. While a hydrogen gas is made to flow into the chamber, the sample is heated to 1100° C. and kept at 1100° C. for 5 minutes.

Then, in the condition that the temperature is kept 1100° C., the second group III nitride compound semiconductor layer containing the n-type clad layer 16 and layers following the n-type clad layer 16 is formed in accordance with an ordinary method (MOCVD method). In this growth method, an ammonia gas and gasses of group III metal alkyl compounds such as trimethylgallium (TAG), trimethylaluminum (TMA), and trimethylindium (TMI) are supplied to a substrate that has been heated to an appropriate temperature and are subjected to a thermal decomposition reaction to thereby grow a desired crystal on the substrate.

The crystallinity of the second group III nitride compound semiconductor layer formed in the aforementioned manner in this embodiment is excellent.

A light-transmissible electrode 19, which is constituted by a thin film containing gold, is laminated to cover the substantially almost whole area of an upper face of the p-type clad layer 18. A p-type electrode 20, which is constituted also by a material containing gold, is formed on the light-transmissible electrode 19 by means of evaporation.

An n-type electrode 21 is formed by means of evaporation onto a face of the n-GaN layer 16 revealed by means of etching.

Figure 10:
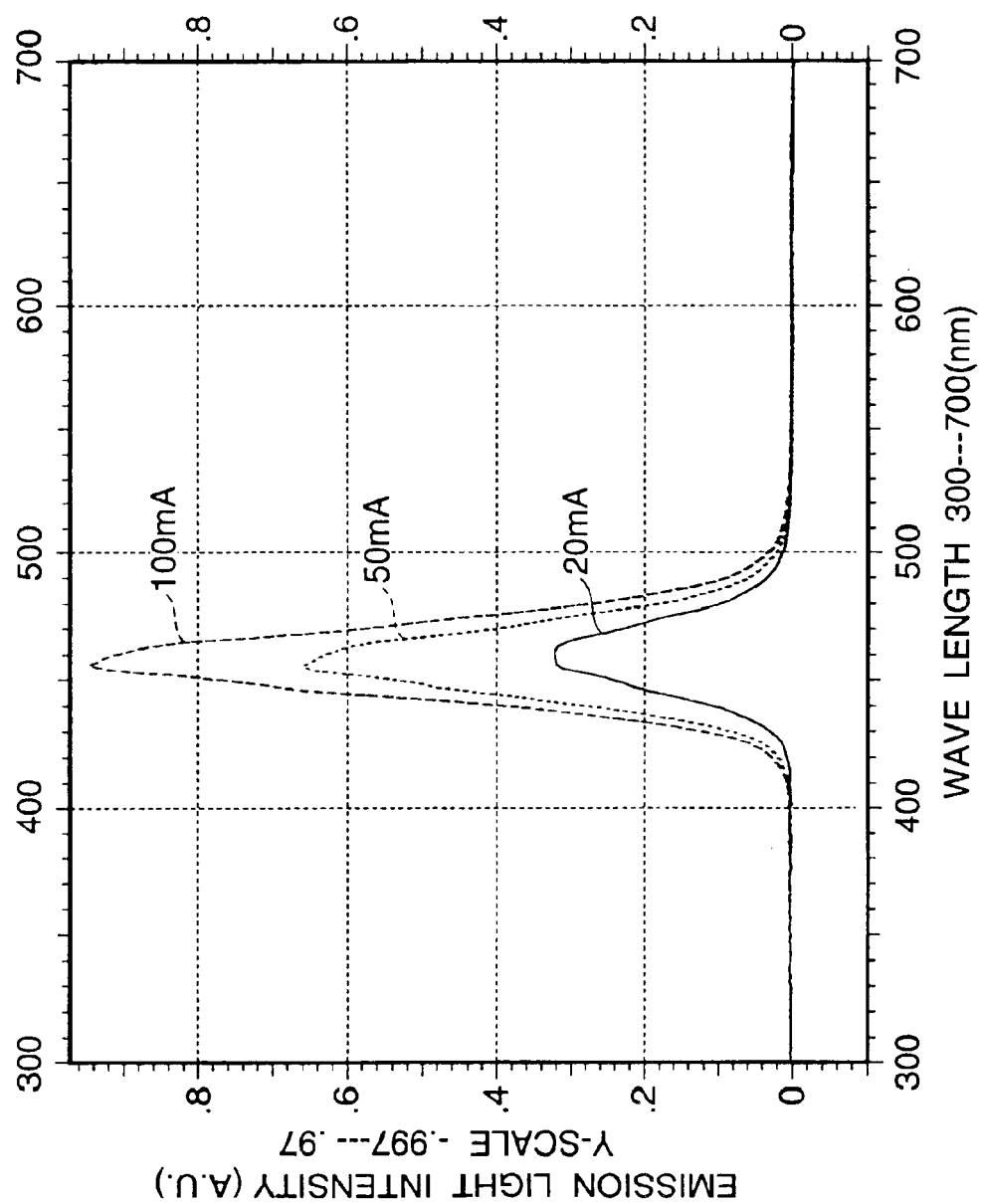
FIG. 10 shows light-emitting characteristic of the light-emitting diode depicted in FIG. 9.

When currents of 20, 50 and 100 mA were applied to the light-emitting diode 10 configured as shown in FIG. 9, light emission (EL spectrum) shown in FIG. 10 was achieved.

When the light-emitting diode 10 was enclosed in a cannonball type package, emission light intensity of 1 cd or larger was exhibited.

(Third Embodiment)

Figure 11:
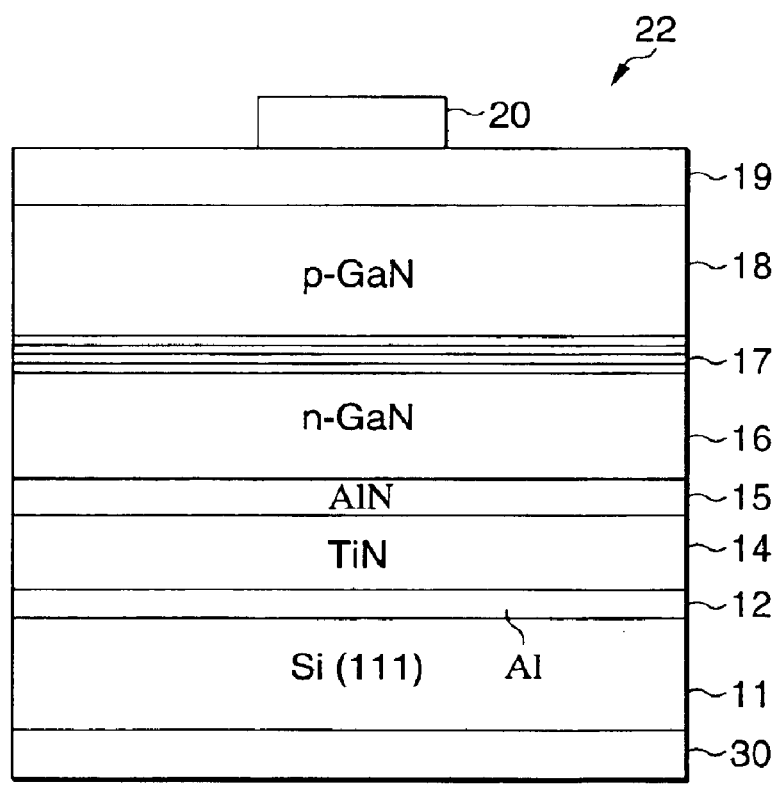
FIG. 11 is a view showing the configuration of a light-emitting diode as a third embodiment of the present invention.

FIG. 11 shows a light-emitting diode 22 as a third embodiment. Incidentally, the same parts as shown in the second embodiment are referred to by the same characters so that the description thereof will be omitted.

| Layer | Composition | Dopant | (Thickness) |
|---|---|---|---|
| p-type clad layer 18 | p-GaN | Mg | (0.3 μm) |
| light-emitting layer 17 | superlattice structure | | |
| Quantum well layer | $In_{0.15}Ga_{0.85}N$ | | (35 Å) |
| Barrier layer | GaN | | (35 Å) |
| the number of repeated quantum well and barrier layers: 1 to 10 | | | |
| n-type clad layer 16 | n-GaN | Si | (4 μm) |
| Buffer layer 15 | AlN | | (600 Å) |
| TiN layer 14 | TiN single crystal | | (3000 Å) |
| Al layer 12 | Al | | (100 Å) |
| Substrate 11 | Si (111) | | (300 μm) |

The Al layer formed on an Si (111) face is epitaxially grown by a general method, that is, by an evaporation method or by a sputtering method.

The method for the growth of the TiN layer 14 and layers following the TiN layer 14 is the same as in the second embodiment.

Incidentally, an n-type electrode 30 is formed on the Si substrate layer 11 and bonded to desired position.

(Fourth Embodiment)

Figure 12:
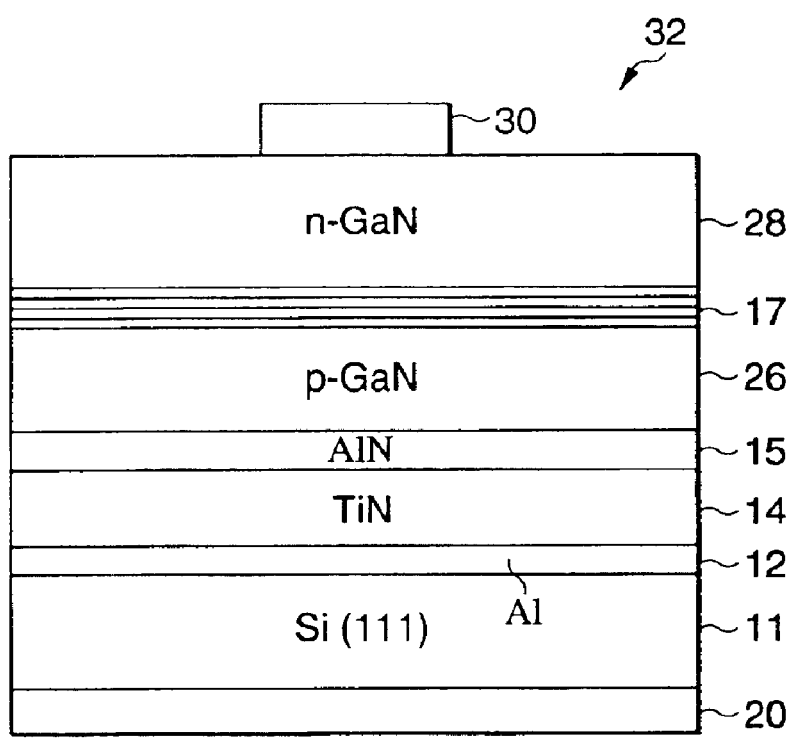
FIG. 12 is a view showing the configuration of a light-emitting diode as a fourth embodiment of the present invention.

FIG. 12 shows a semiconductor device as a fourth embodiment of this invention. The semiconductor device in this embodiment is a light-emitting diode 32. Incidentally, the same parts as shown in FIG. 11 are referred to by the same characters so that the description thereof will be omitted.

Specifications of respective layers are as follows.

| Layer | Composition | Dopant | (Thickness) |
|---|---|---|---|
| n-type clad layer 28 | n-GaN | Si | (0.3 μm) |
| Light-emitting layer 17 | superlattice structure | | |
| Quantum well layer | $In_{0.15}Ga_{0.85}N$ | | (35 Å) |
| Barrier layer | GaN | | (35 Å) |
| The number of repeated quantum well and barrier layers: 1 to 10 | | | |
| p-type clad layer 26 | p-GaN | Mg | (4 μm) |
| Buffer layer 15 | AlN | | (600 Å) |
| TiN layer 14 | TiN single crystal | | (3000 Å) |
| Al layer 12 | Al | | (100 Å) |
| Substrate 11 | Si (111) | | (300 μm) |

As shown in FIG. 12, the p-type clad layer 26, the light-emitting layer 17 and the n-type clad layer 28 are grown successively on the buffer layer 15 to thereby form the light-emitting diode 32. In the case of this device 32, the light-transmissible electrode (see the reference character 19 in FIG. 11) can be omitted because the n-type clad layer 28 of low resistance is provided as the uppermost face.

In FIG. 12, the reference character 30 designates an n-type electrode. A p-type electrode 20 is formed on the Si substrate 11.

Although the aforementioned embodiments have shown the case where the buffer layer is formed by a DC magnetron sputtering method, the invention may be applied also to the case where the buffer layer is formed by an MOCVD method, or the like, (if the growth temperature is as high as 1000° C.).

The device to which the present invention is applied is not limited to the aforementioned light-emitting diode. The present invention may be applied also to optical devices such as a photodetector, a laser diode, a solar cell, etc., bipolar devices such as a rectifier, a thyristor, a transistor, etc., unipolar devices such as an FET, etc., and electronic devices such as a microwave device, etc.

The present invention may be further applied to laminates which are intermediates of these devices.

This invention is not limited to the aforementioned description of the mode for carrying out the invention and embodiments thereof at all, and includes various modifications that can be conceived by those skilled in the art without departing from the scope of claim for a patent.

The following items will be disclosed hereunder.

(11) A laminate comprising:
a substrate;
an undercoat layer formed on the substrate and containing at least one member selected from the group consisting of titanium nitride, zirconium nitride, hafnium nitride, and tantalum nitride; and
a group III nitride compound semiconductor layer formed on the undercoat layer.

(12) A laminate according to the paragraph (11), wherein the substrate is made of any one of sapphire, silicon carbide, gallium nitride, silicon, gallium phosphide, and gallium arsenide.

(13) A laminate according to the paragraph (11) or (12), wherein the substrate is constituted by a cubic crystal material with a (111) face or a hexagonal crystal material on which the undercoat layer is formed.

(14) A laminate according to any one of the paragraphs (11) to (13), wherein a titanium layer is interposed between the undercoat layer and the group III nitride compound semiconductor layer.

(15) A laminate according to any one of the paragraphs (11) to (14), wherein the undercoat layer is heated at a temperature of from 600 to 1200 before the group III nitride compound semiconductor layer is formed.

(16) A laminate according to any one of the paragraphs (11) to (15), wherein the group III nitride compound semiconductor layer is a buffer layer.

(17) A laminate according to the paragraph (16), wherein:
a second group III nitride compound semiconductor layer to form a device function portion on the buffer layer; and
the buffer layer is formed by an MOCVD method at a temperature substantially equal to or higher than the temperature for the growth of the second group III nitride compound semiconductor layer.

(18) A laminate according to the paragraph (16), wherein the buffer layer is formed by any one of a sputtering method, a vapor deposition method, and an ion plating method.

(21) A method of producing a group III nitride compound semiconductor device, comprising the steps of: forming an undercoat layer, which contains at least one member selected from the group consisting of titanium nitride, zirconium nitride, hafnium nitride, and tantalum nitride, on a substrate; heating the undercoat layer at a temperature of from 600 to 1200° C.; and forming a group III nitride compound semiconductor layer on the undercoat layer.

(22) A producing method according to the paragraph (21), wherein the temperature used for the heating is from 800 to 1200° C.

(23) A producing method according to the paragraph (21) or (22), wherein the heating is performed in a hydrogen gas.

(24) A producing method according to the paragraph (21) or (22), wherein the heating is performed in a vacuum.

(31) A group III nitride compound semiconductor device comprising:
a substrate;
an undercoat layer formed on the substrate and containing at least one member selected from the group consisting of titanium nitride, zirconium nitride, hafnium nitride, and tantalum nitride; and
a group III nitride compound semiconductor layer formed on the undercoat layer,
wherein the undercoat layer is subjected to heat treatment at temperature from 600 to 1200° C.

(32) A device according to the paragraph (31), wherein the temperature used for the heating is from 800 to 1200° C.

(33) A device according to the paragraph (31) or (32), wherein the heating is performed in a hydrogen gas.

(34) A device according to the paragraph (31) or (32), wherein the heating is performed in a vacuum.

(41) A method of producing a laminate comprising the steps of: forming an undercoat layer on a substrate, said undercoat layer containing at least one member selected from the group consisting of titanium nitride, zirconium nitride, hafnium nitride, and tantalum nitride; and
heating the undercoat layer at temperature from 600 to 1200° C. to form a group III nitride compound semiconductor layer on the undercoat layer.

(42) A producing method according to the paragraph (41), wherein the temperature used for the heating is from 800 to 1200° C.

(43) A producing method according to the paragraph (41) or (42), wherein the heating is performed in a hydrogen gas.

(44) A device according to the paragraph (41) or (42), wherein the heating is performed in a vacuum.

(51) A laminate comprising:
a substrate;
an undercoat layer formed on the substrate and containing at least one member selected from the group consisting of titanium nitride, zirconium nitride, hafnium nitride, and tantalum nitride; and
a group III nitride compound semiconductor layer formed on the undercoat layer,
wherein the undercoat layer is subjected to heat treatment at temperature from 600 to 1200° C.

(52) A laminate according to the paragraph (51), wherein the temperature used for the heating is from 800 to 1200° C.

(53) A laminate according to the paragraph (51) or (52), wherein the heating is performed in a hydrogen gas.

(54) A laminate according to the paragraph (51) or (52), wherein the heating is performed in a vacuum.

(61) A method of producing a group III nitride compound semiconductor device, comprising the steps of: preparing a substrate having an undercoat layer containing at least one member selected from the group consisting of titanium nitride, zirconium nitride, hafnium nitride, and tantalum nitride; and forming a buffer layer of a first group III nitride compound semiconductor layer on the undercoat layer by an MOCVD method at a temperature substantially equal to or higher than the temperature for the growth of a second group III nitride compound semiconductor layer which will be formed thereafter by an MOCVD method so as to constitute a device function portion.

(62) A method of producing a group III nitride compound semiconductor device, comprising the steps of: preparing a substrate having an undercoat layer containing at least one member selected from the group consisting of titanium nitride, zirconium nitride, hafnium nitride, and tantalum nitride; forming a buffer layer of a first group III nitride compound semiconductor layer on the undercoat layer by an MOCVD method at a temperature of from 600 to 1200° C.; and forming a second group III nitride compound semiconductor layer on the buffer layer.

(63) A producing method according to the paragraph (62), wherein the temperature for the growth of the buffer layer is from 800 to 1200° C.

(64) A producing method according to the paragraph (62), wherein the temperature for the growth of the buffer layer is about 1000° C.

(65) A producing method according to any one of the paragraphs (61) to (64), wherein the buffer layer is formed of $Al_aGa_{1-a}N$ ($0 \leq a \leq 1$).

(66) A producing method according to any one of the paragraphs (61) to (64), wherein the buffer layer is formed of AlN.

(67) A producing method according to any one of the paragraphs (61) to (64), wherein: the undercoat layer is formed of titanium nitride; and the buffer layer is formed of AlN.

(68) A producing method according to any one of the paragraphs (61) to (67), wherein the undercoat layer is heated before the buffer layer is formed.

(69) A producing method according to the paragraph (68), wherein the heating is performed in a hydrogen gas or in a vacuum.

(71) A group III nitride compound semiconductor device comprising:
a substrate having an undercoat layer containing at least one member selected from the group consisting of titanium nitride, zirconium nitride, hafnium nitride, and tantalum nitride;
a buffer layer of a first group III nitride compound semiconductor layer formed on the undercoat layer; and
a second group III nitride compound semiconductor layer formed on said buffer layer and for constituting a device function portion;
wherein said buffer layer is formed by an MOCVD method at a temperature substantially equal to or higher than the temperature for the growth of the second group III nitride compound semiconductor layer.

(72) A group III nitride compound semiconductor device comprising:
a substrate having an undercoat layer containing at least one member selected from the group consisting of titanium nitride, zirconium nitride, hafnium nitride, and tantalum nitride;
a buffer layer of a first group III nitride compound semiconductor layer formed on the undercoat layer;
a second group III nitride compound semiconductor layer formed on said buffer layer and constituting a device function portion;
wherein said buffer layer is formed by an MOCVD method at a temperature for the growth from 600 to 1200° C.

(73) A device according to the paragraph (72), wherein the temperature for the growth of the buffer layer is from 800 to 1200° C.

(74) A device according to the paragraph (72), wherein the temperature for the growth of the buffer layer is about 1000° C.

(75) A device according to any one of the paragraphs (71) to (74), wherein the buffer layer is formed of $Al_aGa_{1-a}N$ ($0 \leq a \leq 1$).

(76) A device according to any one of the paragraphs (71) to (74), wherein the buffer layer is formed of AlN.

(77) A device according to any one of the paragraphs (71) to (74), wherein: the undercoat layer is formed of titanium nitride; and the buffer layer is formed of AlN.

(78) A device according to any one of the paragraphs (71) to (77), wherein the undercoat layer is heated before the buffer layer is formed.

(79) A device according to the paragraph (78), wherein the heating is performed in an atmosphere of hydrogen or in a vacuum.

(81) A method of producing a laminate comprising the steps of:
preparing a substrate having an undercoat layer containing at least one member selected from the group consisting of titanium nitride, zirconium nitride, hafnium nitride, and tantalum nitride; and
forming a buffer layer of a first group III nitride compound semiconductor layer on the undercoat layer by a MOCVD method at a temperature substantially equal to or higher than the temperature for the growth of a second group III nitride compound semiconductor layer which will be formed thereafter by a MOCVD method.

(82) A method of producing a laminate, comprising the steps of:
preparing a substrate having an undercoat layer containing at least one member selected from the group consisting of titanium nitride, zirconium nitride, hafnium nitride, and tantalum nitride;
forming a buffer layer of a first group III nitride compound semiconductor layer on the undercoat layer by an MOCVD method at a temperature of from 600 to 1200° C.; and
forming a second group III nitride compound semiconductor layer on the buffer layer.

(83) A producing method according to the paragraph (82), wherein the temperature for the growth of the buffer layer is from 800 to 1200° C.

(84) A producing method according to the paragraph (82), wherein the temperature for the growth of the buffer layer is about 1000° C.

(85) A producing method according to any one of the paragraphs (81) to (84), wherein the buffer layer is formed of $Al_aGa_{1-a}N$ ($0 \leq a \leq 1$).

(86) A producing method according to any one of the paragraphs (81) to (84), wherein the buffer layer is formed of AlN.

(87) A producing method according to any one of the paragraphs (81) to (84), wherein: the undercoat layer is formed of titanium nitride; and the buffer layer is formed of AlN.

(88) A producing method according to any one of the paragraphs (81) to (87), wherein the undercoat layer is heated before the buffer layer is formed.

(89) A producing method according to the paragraph (88), wherein the heating is performed in a hydrogen gas or in a vacuum.

(91) A laminate comprising:
a substrate having an undercoat layer containing at least one member selected from the group consisting of titanium nitride, zirconium nitride, hafnium nitride, and tantalum nitride;
a buffer layer of a first group III nitride compound semiconductor layer formed on the undercoat layer; and
a second group III nitride compound semiconductor layer formed on said buffer layer and for constituting a device function portion;
wherein said buffer layer is formed by an MOCVD method at a temperature substantially equal to or higher than the temperature for the growth of the second group III nitride compound semiconductor layer.

(92) A laminate comprising:
a substrate having an undercoat layer containing at least one member selected from the group consisting of titanium nitride, zirconium nitride, hafnium nitride, and tantalum nitride;
a buffer layer of a first group III nitride compound semiconductor layer formed on the undercoat layer;
a second group III nitride compound semiconductor layer formed on said buffer layer and constituting a device function portion;
wherein said buffer layer is formed by an MOCVD method at a temperature for the growth from 600 to 1200° C.

(93) A laminate according to the paragraph (92), wherein the temperature for the growth of the buffer layer is from 800 to 1200° C.

(94) A laminate according to the paragraph (92), wherein the temperature for the growth of the buffer layer is about 1000° C.

(95) A laminate according to any one of the paragraphs (91) to (94), wherein the buffer layer is formed of $Al_aGa_{1-a}N$ ($0 \leq a \leq 1$).

(96) A laminate according to any one of the paragraphs (91) to (94), wherein the buffer layer is formed of AlN.

(97) A laminate according to any one of the paragraphs (91) to (94), wherein: the undercoat layer is formed of titanium nitride; and the buffer layer is formed of AlN.

(98) A laminate according to any one of the paragraphs (91) to (97), wherein the undercoat layer is heated before the buffer layer is formed.

(99) A laminate according to the paragraph (98), wherein the heating is performed in a hydrogen gas or in a vacuum.

(101) A method of producing a group III nitride compound semiconductor device, comprising the steps of:
preparing a substrate having an undercoat layer containing at least one member selected from the group consisting of titanium nitride, zirconium nitride, hafnium nitride, and tantalum nitride;
forming a buffer layer of a first group III nitride compound semiconductor layer on the undercoat layer by a method other than an MOCVD method; and
forming a second group III nitride compound semiconductor layer constituting a device function portion on the buffer layer.

(102) A producing method according to the paragraph (101), wherein the buffer layer is formed of $Al_aGa_{1-a}N$ ($0 \leq a \leq 1$).

(103) A producing method according to the paragraph (101), wherein the buffer layer is formed of AlN.

(104) A producing method according to (101), wherein: the undercoat layer is formed of titanium nitride; and the buffer layer is formed of AlN.

(105) A producing method according to the paragraph (101), wherein the buffer layer is formed by DC magnetron sputter method.

(106) A producing method according to any one of the paragraphs (101) to (105), wherein the substrate having the undercoat layer is heated before the buffer layer is formed.

(107) A producing method according to the paragraph (106), wherein the heating is performed in a hydrogen gas or in a vacuum.

(108) A producing method according to any one of the paragraphs (101) to (107), wherein the buffer layer formed on the undercoat layer is heated in an atmosphere of a mixture of a hydrogen gas and an ammonia gas, and thereafter the second group III nitride compound semiconductor layer is formed.

(111) A group III nitride compound semiconductor device, comprising:
a substrate having an undercoat layer of metal nitride;
a buffer layer formed on the undercoat layer and made of a first group III nitride compound semiconductor layer;
a second group III nitride compound semiconductor layer formed on the buffer layer and for constituting a device function portion;
wherein the buffer layer is formed by a method other than an MOCVD method.

(112) A device according to the paragraph (111), wherein the buffer layer is formed of $Al_aGa_{1-a}N$ ($0 \leq a \leq 1$).

(113) A device according to the paragraph (111), wherein the buffer layer is formed of AlN.

(114) A device according to (111), wherein: the undercoat layer is formed of titanium nitride; and the buffer layer is formed of AlN.

(115) A device according to the paragraph (111), wherein the buffer layer is formed by DC magnetron sputter method.

(116) A device according to any one of the paragraphs (111) to (115), wherein the substrate having the undercoat layer is heated before the buffer layer is formed.

(117) A device according to the paragraph (116), wherein the heating is performed in a hydrogen gas or in a vacuum.

(118) A device according to any one of the paragraphs (111) to (117), wherein the buffer layer formed on the undercoat layer is heated in an atmosphere of a mixture of a hydrogen gas and an ammonia gas, and thereafter the second group III nitride compound semiconductor layer is formed.

(121) A method of producing a laminate comprising the steps of:
preparing a substrate having an undercoat layer containing at least one member selected from the group consisting of titanium nitride, zirconium nitride, hafnium nitride, and tantalum nitride;
forming a buffer layer of a first group III nitride compound semiconductor layer formed on the metal nitride undercoat layer by a method other than an MOCVD method; and
forming a second group III nitride compound semiconductor layer constituting a device function portion on the buffer layer.

(122) A producing method according to the paragraph (121), wherein the buffer layer is formed of $Al_aGa_{1-a}N$ ($0 \leq a \leq 1$).

(123) A producing method according to the paragraph (121), wherein the buffer layer is formed of AlN.

(124) A producing method according to (121), wherein: the undercoat layer is formed of titanium nitride; and the buffer layer is formed of AlN.

(125) A producing method according to the paragraph (121), wherein the buffer layer is formed by DC magnetron sputter method.

(126) A producing method according to any one of the paragraphs (121) to (125), wherein the substrate having the undercoat layer is heated before the buffer layer is formed.

(127) A producing method according to the paragraph (126), wherein the heating is performed in an atmosphere of hydrogen or in a vacuum.

(128) A producing method according to any one of the paragraphs (121) to (127), wherein the buffer layer formed on the undercoat layer is heated in an atmosphere of a mixture of a hydrogen gas and an ammonia gas, and thereafter the second group III nitride compound semiconductor layer is formed.

(131) A laminate comprising:
a substrate having an undercoat layer containing at least one member selected from the group consisting of titanium nitride, zirconium nitride, hafnium nitride, and tantalum nitride;
a buffer layer of a first group III nitride compound semiconductor layer formed on the undercoat layer; and
a second group III nitride compound semiconductor layer constituting a device function portion on the buffer layer;
wherein the buffer layer is formed by a method other than an MOCVD method.

(132) A laminate according to the paragraph (131), wherein the buffer layer is formed of $Al_aGa_{1-a}N$ ($0 \leq a \leq 1$).

(133) A laminate according to the paragraph (131), wherein the buffer layer is formed of AlN.

(134) A laminate according to (131), wherein: the undercoat layer is formed of titanium nitride; and the buffer layer is formed of AlN.

(135) A laminate according to the paragraph (131), wherein the buffer layer is formed by DC magnetron sputter method.

(136) A laminate according to any one of the paragraphs (131) to (135), wherein the substrate having the undercoat layer is heated before the buffer layer is formed.

(137) A producing method according to the paragraph (136), wherein the heating is performed in an atmosphere of hydrogen or in a vacuum.

(138) A laminate according to any one of the paragraphs (131) to (137), wherein the buffer layer formed on the undercoat layer is heated in an atmosphere of a mixture of a hydrogen gas and an ammonia gas, and thereafter the second group III nitride compound semiconductor layer is formed.

The inventors of the present application have made examination eagerly to find a novel substrate adapted for the growth of a GaN semiconductor layer. As a result, the inventors have conceived the following paragraphs and disclosed them in Japanese Patent Publication No. Hei. 11-195814 which is incorporated herein by reference.

That is, the inventors have conclusively conceived that the substrate must satisfy at least two of the following requirements ① to ⑤ for hetero epitaxial growth of a GaN semiconductor on the substrate.

① The adherence between the GaN semiconductor and the substrate is good;
② The thermal expansion coefficient of the GaN semiconductor is near to that of the substrate;
③ The elastic modulus of the substrate is low;
④ The crystal structure of the substrate is equal to that of the GaN semiconductor; and
⑤ The ratio of the absolute value of the difference between the lattice constant of the substrate and the lattice constant of the GaN semiconductor to the lattice constant of the GaN semiconductor is not larger than 0.05 (that is, the difference between the lattice constant of the substrate and the lattice constant of the GaN semiconductor is not larger than ±5%).

It is a matter of course that the substrate may satisfy preferably at least three of the five requirements, more preferably at least four of the five requirements, most preferably all the five requirements.

In the aforementioned Japanese Patent Publication No. 11-195814, attention has been paid to several metal materials as materials satisfying the aforementioned condition. Ti has been disclosed as one of the metal materials.

According to the aforementioned Patent Application, at least a surface of the substrate, that is, a substrate's face touching the GaN semiconductor layer must satisfy the aforementioned requirements.

Hence, the base portion of the substrate can be formed from an optional material and the surface portion of the substrate can be formed from a material satisfying the aforementioned requirements.

A buffer layer of $Al_aIn_bGa_{1-a-b}N$ (inclusive of a=0, b=0, a=b=0) such as AlN or GaN can be interposed between the semiconductor layer and the substrate in the same manner as in the case of a sapphire substrate.

On the other hand, according to Japanese Patent Publication No. 11-195814 which is incorporated herein by reference, a semiconductor device configured so that a buffer layer for buffering stress is interposed between an Si substrate and a GaN semiconductor layer has been disclosed. Although attention has been paid to several metal materials as materials for forming the buffer layer for buffering stress in the aforementioned Japanese Patent Publication No. Hei. 11-195814, Ti has been disclosed as one of the metal materials. That is, a semiconductor device configured so that a Ti layer is formed on an Si substrate and then a GaN semiconductor layer is formed on the Ti layer has been disclosed.

It has been described more in detail in Japanese Patent Publication No. 11-195814 that such a Ti layer is preferably used as an undercoat layer for a GaN semiconductor layer when an Si substrate is used.

The inventors of the present application have further examined a technique for laminating a Ti layer on an Si substrate and growing a GaN semiconductor layer on the Ti layer as an undercoat layer. As a result, it has been found that both morphological characteristic and crystallinity of a surface of the Ti layer are lowered when the substrate of Ti/Si is exposed to an environment of 700° C. or higher. It is thought of that this is because Ti and Si react with each other at the aforementioned temperature. Incidentally, there is a possibility that the reaction of Ti and Si has a bad influence on the crystallinity of the GaN semiconductor layer because the GaN semiconductor layer is generally grown at a temperature of about 1000° C.

This invention is designed to solve the problem found by the present inventors and the configuration thereof is as follows.

That is, a GaN semiconductor device comprising:
 a substrate of Si;
 a Ti layer formed on the substrate;
 a GaN semiconductor layer formed on the Ti layer; and
 a heat-resisting layer which is interposed between the substrate and the Ti layer to separate the substrate and the Ti layer from each other and which keeps the substrate and the Ti layer in a separate state at a temperature for the formation of the GaN semiconductor layer.

In the semiconductor device configured as described above according to the present invention, the reaction of the Ti layer and the Si substrate is prevented securely because the heat-resisting layer is interposed between the Ti layer and the Si substrate. As a result, the crystallinity of the GaN semiconductor layer is improved. The device having the GaN semiconductor layer of good crystallinity fulfills a preferred operation. Incidentally, in the above description, both the Ti layer and the heat-resisting layer fulfill the role of an undercoat layer.

(Si Substrate)

In the above description, the Si substrate preferably uses its (111) face so that the heat-resisting layer, etc. are grown on the (111) face of the substrate successively.

(Heat-resisting Layer)

The heat-resisting layer is not particularly limited if the Si substrate and the Ti layer can be kept in a separate state at a temperature for the formation of the GaN semiconductor layer. For example, silicide of Ti, Co, Ni, etc., a high-melting metal such as Ta, Mo, etc., or metal nitride such as TiN, ZrN, HfN, tantalum nitride, etc. can be used.

In the above description, the silicide is formed by means of forming a film of each metal on the Si substrate and heating the Si substrate. The high-melting metal or the metal nitride is formed by means of CVD (Chemical Vapor Deposition) such as plasma CVD, thermal CVD, light enhanced CVD, MOCVD, etc., PVD (Physical Vapor Deposition) such as sputtering, reactive sputtering, laser ablation, ion plating, evaporation, ECR, etc., or the like.

Also the thickness of the heat-resisting layer is not particularly limited if the heat-resisting layer can prevent the respective materials of the Si substrate and the Ti layer from reacting with each other. For example, the thickness of the heat-resisting layer is set to be in a range of from 50 to 10000 Å when TiN is used as the heat-resisting layer.

The heat-resisting layer is preferably formed from an electrically conductive material. Also the Si substrate and the Ti layer are electrically conductive. As a result, electrodes can be formed on opposite faces of the semiconductor device, so that the "charge-up" problem can be solved.

When TiN is used as the heat-resisting layer, an Al layer or an Ag layer is preferably interposed between the Si substrate and the TiN layer. The thickness of the Al or Ag layer is not particularly limited but may be set to be in a range of from 50 to 250 Å. For example, the Al or Ag layer is formed by means of evaporation or sputtering.

(Ti Layer)

Also the Ti layer is formed by the aforementioned means of CVD, PVD, or the like. According to the inventors' examination, there is a risk that the peeling of the Ti layer occurs when the Ti layer is made thicker than about 250 Å. Hence, the thickness of the Ti layer is preferably set to be not larger than 250 Å.

When the Ti layer is made thin, it is, however, a risk that the expected buffering function of the Ti layer cannot be fulfilled, that is, the function of buffering internal stress caused by the difference between the thermal expansion coefficient of the Si substrate and the thermal expansion coefficient of the GaN semiconductor cannot be fulfilled.

In this invention, therefore, heat-resisting layers and Ti layers (each having a thickness of 250 Å or smaller) are laminated repetitively so that the aforementioned buffering function is shared among the Ti layers. Hence, the buffering function of the Ti layers can be secured while the Ti layers are prevented from peeling off, so that the GaN semiconductor layer can be prevented from cracking or being distorted.

The number of the repeated heat-resisting and Ti layers is not particularly limited but, for example, set to be in a range of from 2 to 10.

After the Ti layer is formed in the aforementioned manner, the Ti layer/heat-resisting layer/Si substrate is preferably heated. The temperature for the heating is in a range of from 600 to 1200° C., preferably in a range of from 800 to 1200° C. The heating is performed in a vacuum or in an atmosphere of hydrogen.

A buffer layer is preferably interposed between the Ti layer and the GaN semiconductor layer. The buffer layer is preferably formed of $Al_aGa_{1-a}N$ (in which a is from 0.85 to 0.95), more preferably formed of $Al_aGa_{1-a}N$ (in which a is about 0.9).

(GaN Semiconductor Layer)

The GaN semiconductor is a group III metal nitride semiconductor which is generally represented by $Al_XGa_YIn_{1-X-Y}N$ ($0 \leq X \leq 1$, $0 \leq Y \leq 1$, $0 \leq X+Y \leq 1$). The GaN semiconductor may further contain an optional dopant.

A method for forming such a GaN semiconductor layer is not particularly limited but, for example, the GaN semiconductor layer is formed by a known metal organic chemical vapor deposition method (hereinafter abbreviated as "MOCVD method"). Alternatively, the layer can be formed by a known molecular beam epitaxy method (MBE method).

As is commonly known, a light-emitting device or a photodetector is configured so that a light-emitting layer is sandwiched between different electrically conductive types of GaN semiconductor layers (clad layers). A double heterostructure, or the like, is applied to the light-emitting layer. An electronic device represented by an FET structure can be also formed from GaN semiconductors. In this manner, a plurality of GaN semiconductor layers formed on a Ti layer act on one another to fulfil a desired function.

Samples will be described below.

Sample 3

| Layer | Thickness |
| --- | --- |
| TiN | 3000 Å |
| Al | 100 Å |
| Si substrate (111) | 300 μm |

Figure 13:
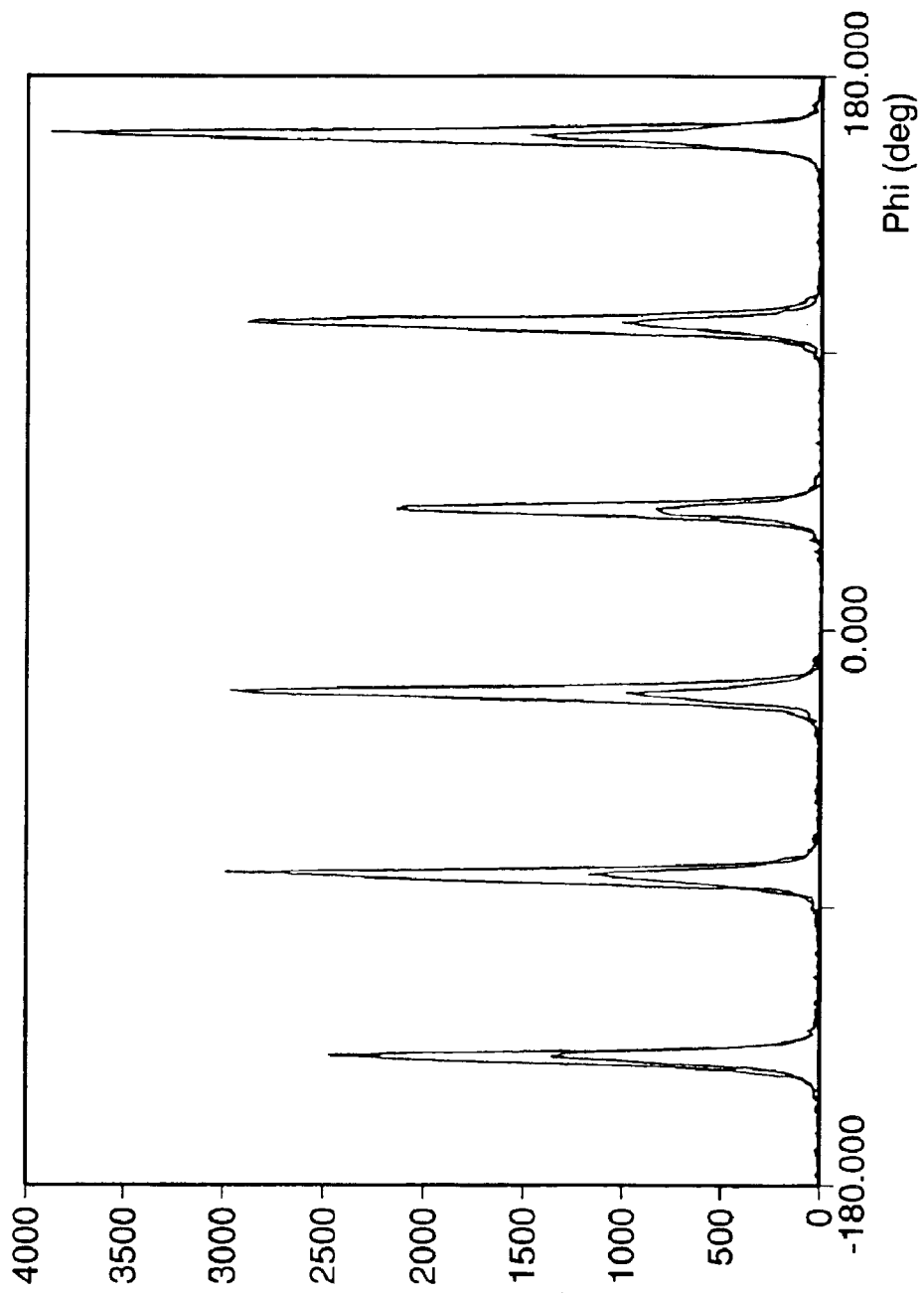
FIG. 13 shows a result of $\phi$(PHI) scanning of a sample 3.

An Al layer (thickness: about 100 Å) was evaporated onto a (111) face of an Si substrate. Titanium nitride (thickness: about 3000 Å) was formed on the Al layer by a reactive sputtering method. The sample was heated at 950° C. in a vacuum for 5 minutes. FIG. 13 shows a result of X-ray diffraction φ(PHI) scanning) of the sample. A quadraxial type single crystal diffraction meter (product name: X-pert) made by Philips Corp. was used as an X-ray diffraction instrument (the same meter is applied also to the following samples). See Journal of Electronic Materials, Vol. 25, No. 11, pp. 1740–1747, 1996, concerning φ(PHI) scanning. In φ(PHI) scanning, peaks corresponding to crystal faces are obtained when the sample is rotated by 360 degrees. FIG. 13 shows peaks of TiN (200) face and TiN (220) face. It is thought of that the larger the value of the ordinate in FIG. 13 becomes, the better crystal is obtained. It is thought of that, when the crystallinity of TiN is good, the crystallinity of a Ti layer grown on the TiN becomes good and, accordingly, the crystallinity of a GaN semiconductor layer becomes good.

It is apparent from the result shown in FIG. 13 that the crystallinity of the TiN crystal produced in the aforementioned manner is good.

Sample 4

| Layer | Thickness |
| --- | --- |
| TiN | 3000 Å |
| Ag | 100 Å |
| Si substrate (111) | 300 μm |

Figure 14:
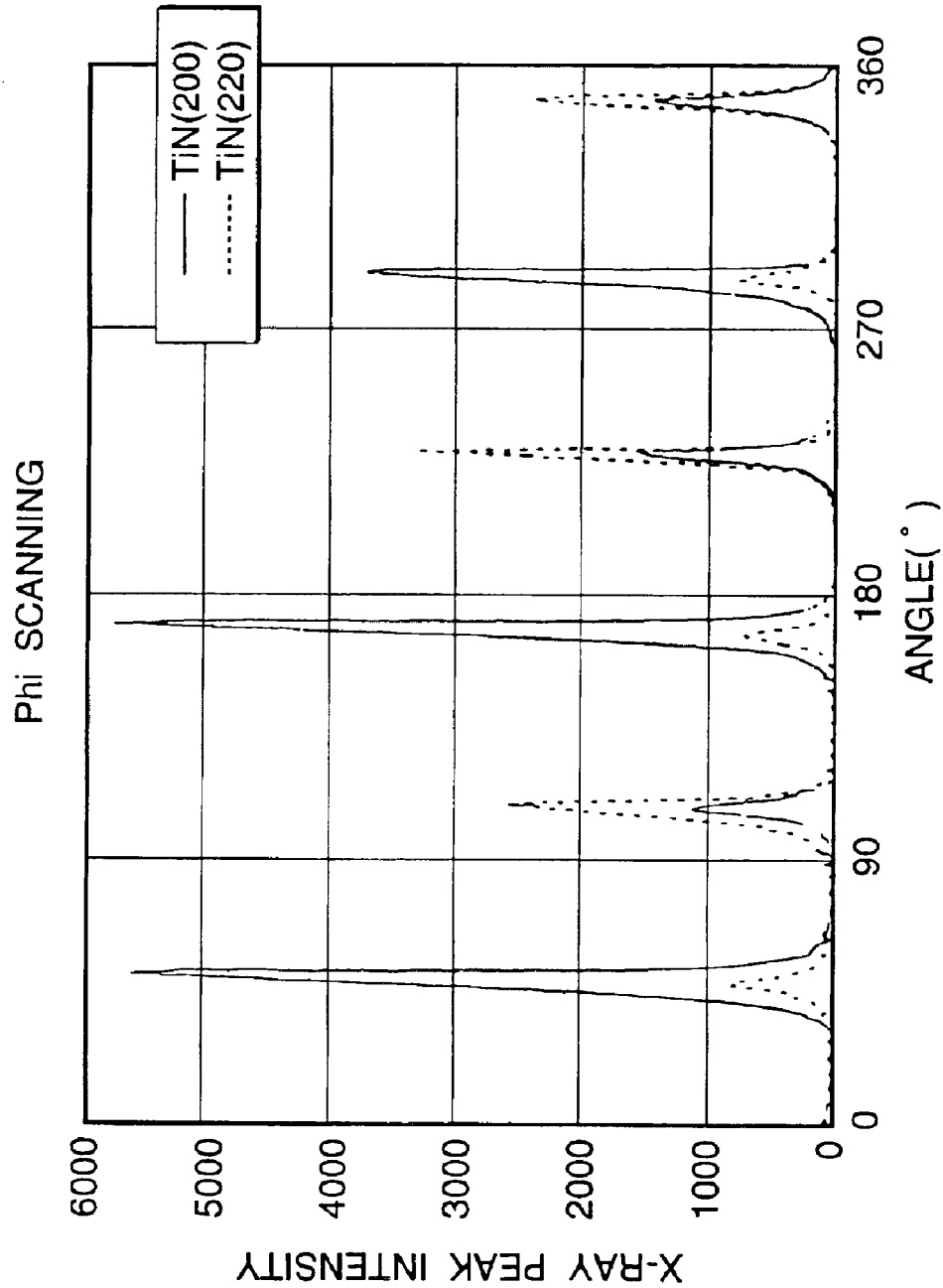
FIG. 14 shows a result of $\phi$(PHI) scanning of a sample 4.

FIG. 14 shows a result of φ(PHI) scanning in the case where the Al layer in the sample 3 is replaced by an Ag layer (thickness: about 100 Å). Also in this case, a TiN layer good in crystallinity was obtained.

Sample 5

| Layer | Thickness |
| --- | --- |
| Ti | 15000 Å |
| TiN | 5000 Å |
| Al | 100 Å |
| Si substrate (111) | 300 μm |

Figure 15:
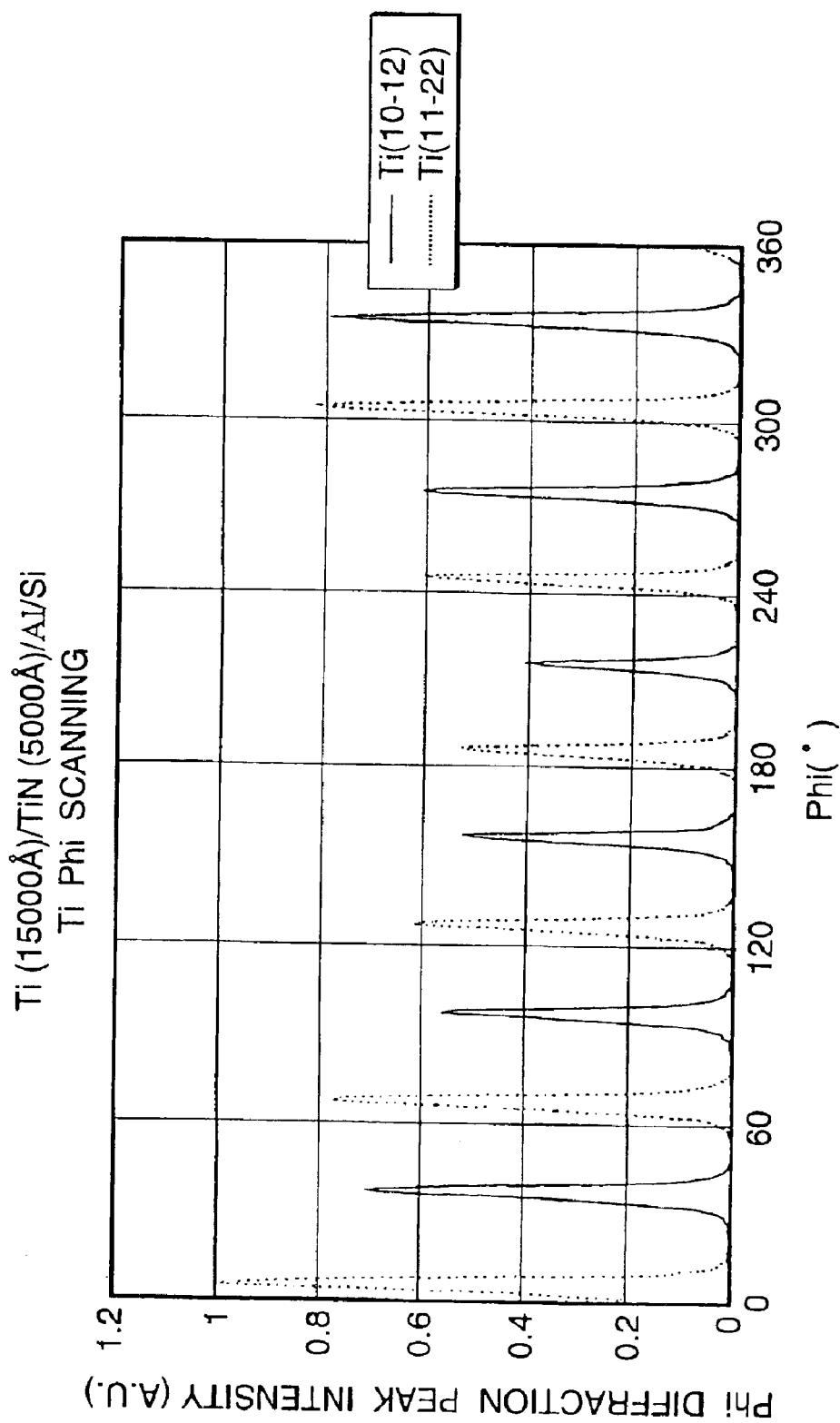
FIG. 15 shows a result of $\phi$(PHI) scanning of a sample 5.

FIG. 15 shows a result of φ(PHI) scanning in the case where Ti is grown on TiN (film thickness: about 5000 Å) in the sample 3 to evaluate the crystallinity of Ti. Symmetric patterns of six peaks corresponding to Ti (102) face and Ti (112) face were confirmed, and a good single crystal Ti layer was obtained.

Sample 6

| Layer | Thickness |
| --- | --- |
| TiN | 3000 Å |
| Ti | 1000 Å |
| TiN | 100 Å |
| Al | 100 Å |
| Si substrate (111) | 300 μm |

In this sample, the thickness of a first TiN layer in the sample 3 was set to be 100 Å and then a 1000 Å-thick Ti layer and a 3000 Å-thick second TiN layer were formed continuously by a reactive sputtering method.

Figure 16:
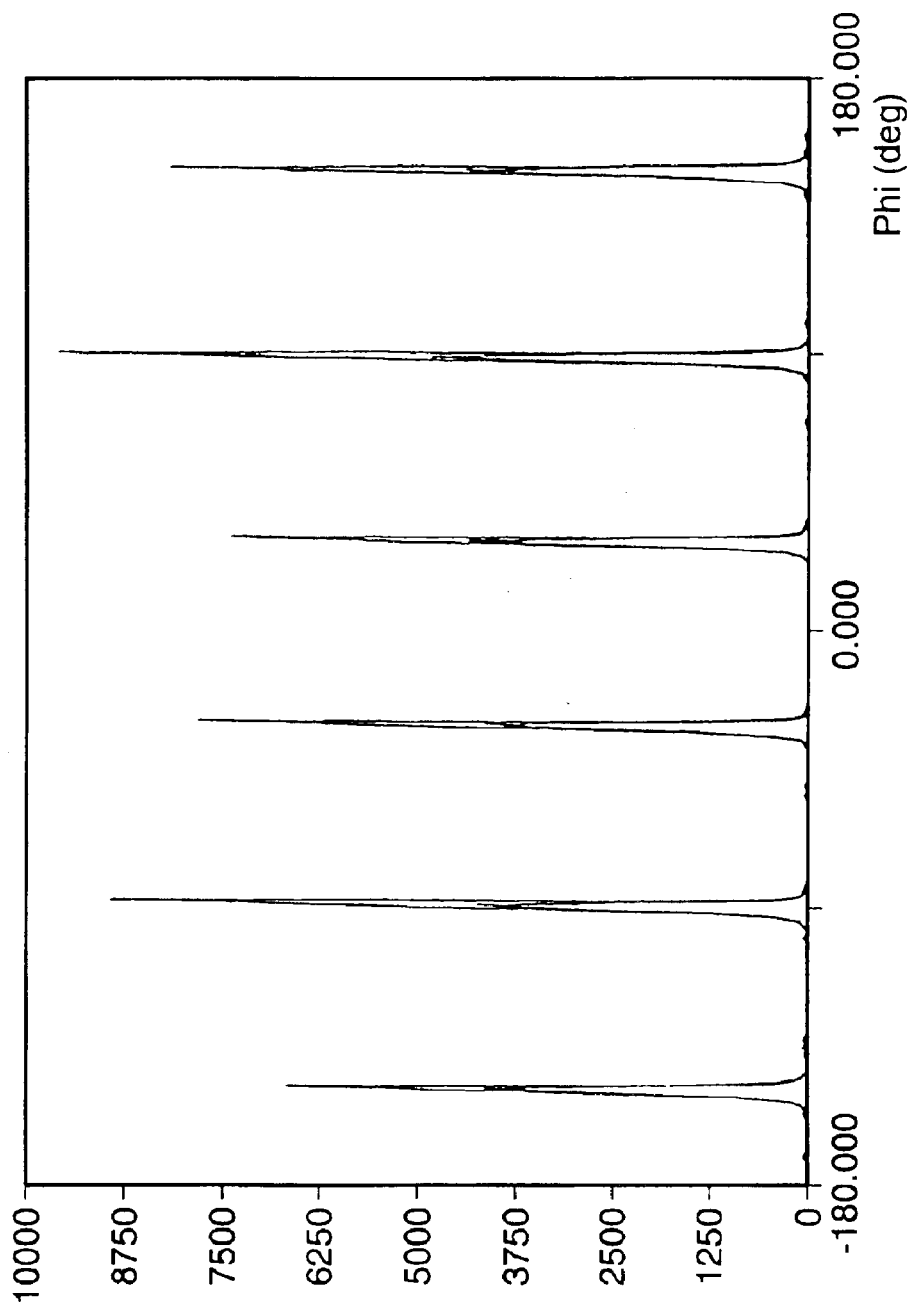
FIG. 16 shows a result of $\phi$(PHI) scanning of a sample 6.

FIG. 16 shows a result of φ(PHI) scanning to evaluate the crystallinity of the TiN layers. Also in this case, TiN layers good in crystallinity were obtained.

Sample 7

| Layer | Thickness |
| --- | --- |
| repetition of TiN (100 Å)/Ti (the number of repetitions: 10) | (250 Å) |
| TiN | 3000 Å |
| Al | 100 Å |
| Si substrate (111) | 300 μm |

In this sample, the thickness of a first TiN layer in the sample 3 was set to be 3000 Å and then 250 Å-thick Ti layers and 100 Å-thick TiN layers were formed alternately by 10 times. The TiN layers and the Ti layers were formed continuously by a reactive sputtering method.

Sample 8

| Layer | Thickness |
| --- | --- |
| repetition of TiN (600 Å)/Ti (the number of repetitions: 4) | (50 Å) |
| TiN | 600 Å |
| Al | 100 Å |
| Si substrate (111) | 300 μm |

In this sample, the thickness of a first TiN layer in the sample 3 was set to be 600 Å and then 50 Å-thick Ti layers and 600 Å-thick TiN layers were formed alternately by 4 times. The TiN layers and the Ti layers were formed continuously by a reactive sputtering method.

Figure 17:
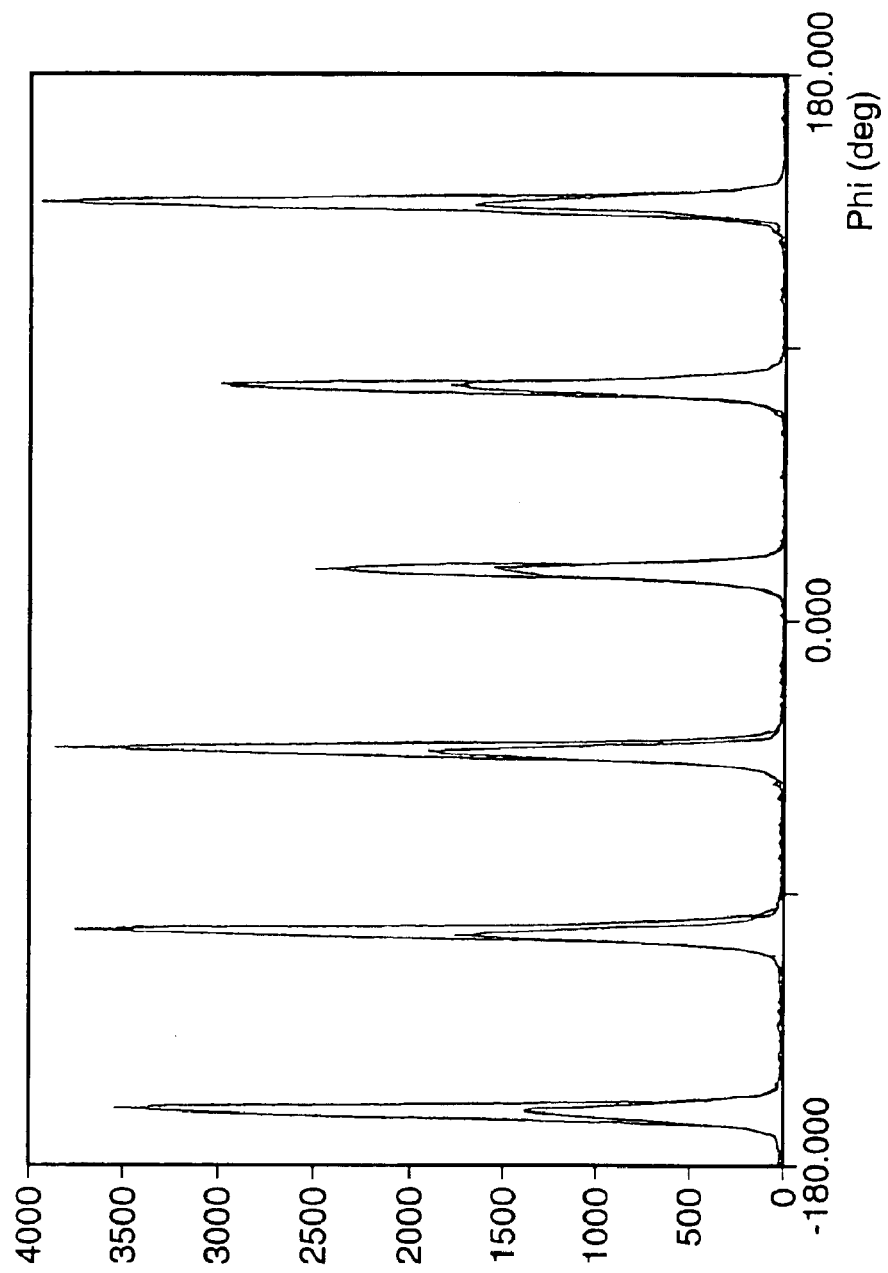
FIG. 17 shows a result of $\phi$(PHI) scanning of a sample 8.

FIG. 17 shows a result of φ(PHI) scanning to evaluate the crystallinity of the TiN layers. Also in this case, TiN layers good in crystallinity were obtained.

Sample 9

| Layer | Thickness |
| --- | --- |
| Ti | 15000 Å |
| Al treated thermally | 100 Å |
| Si substrate (111) | 300 μm |

An Al layer (thickness: about 100 Å) was evaporated onto a (111) face of an Si substrate at ordinary temperature. The substrate was heated at 950° C. for 5 minutes in a vacuum environment. Then, a Ti layer (thickness: 15000 Å) was formed by means of sputtering.

Figure 18:
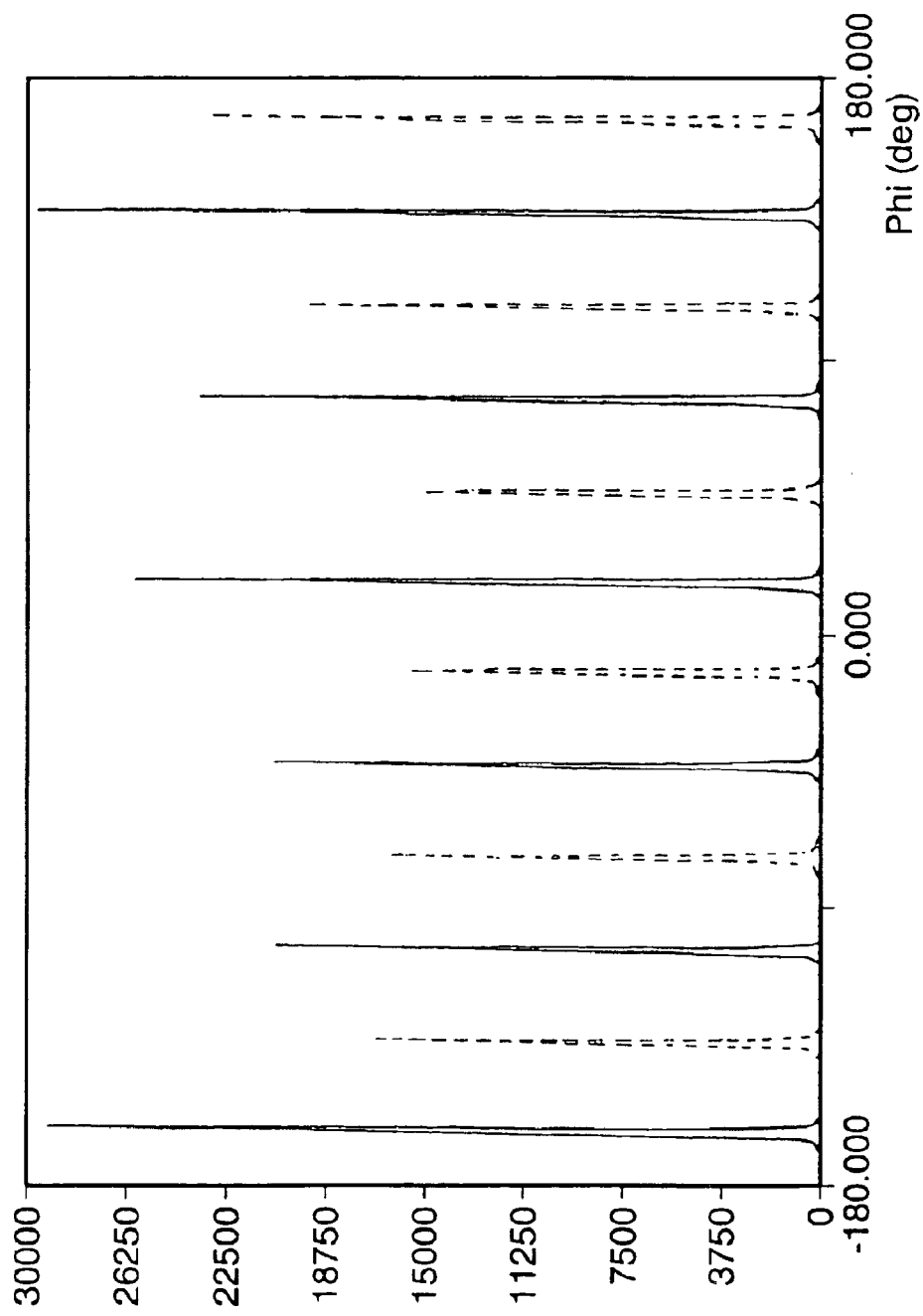
FIG. 18 shows a result of $\phi$(PHI) scanning of a sample 9.

FIG. 18 shows a result of φ(PHI) scanning to evaluate the crystallinity of the Ti layer (15000 Å). Also in this case, a Ti layer good in crystallinity was obtained.

Sample 10

| Layer | Thickness |
| --- | --- |
| Ti | 15000 Å |
| Ti silicide | 50 Å |
| Si substrate (111) | 300 μm |

A Ti layer (thickness: about 50 Å) was evaporated onto a (111) face of an Si substrate at ordinary temperature. The substrate was heated at 950° C. for 5 minutes in a vacuum environment to make Ti react with Si aggressively to thereby form a Ti silicide layer. Then, a Ti layer (thickness: 15000 Å) was formed by means of sputtering.

Also in this case, six peaks corresponding to Ti (102) face and Ti (112) face were confirmed clearly. Hence, it was apparent that the crystallinity of the Ti layer was good.

Sample 11

| Layer | Thickness |
| --- | --- |
| Ti | 15000 Å |
| Co silicide | 100 Å |
| Si substrate (111) | 300 μm |

A Co layer (thickness: about 100 Å) was evaporated onto a (111) face of an Si substrate at ordinary temperature. The substrate was heated at 600° C. for 5 minutes in a vacuum environment to make Co react with Si aggressively to thereby form a Co silicide layer. Then, a Ti layer (thickness: 15000 Å) was formed by means of sputtering.

Also in this case, six peaks corresponding to Ti (102) face and Ti (112) face could be discriminated, so that the single crystal growth of the Ti layer was confirmed.

Sample 12

| Layer | Thickness |
| --- | --- |
| Ti | 15000 Å |
| Ni silicide | 100 Å |
| Si substrate (111) | 300 μm |

An Ni layer (thickness: about 100 Å) was evaporated onto a (111) face of an Si substrate at ordinary temperature. The substrate was heated at 800° C. for 5 minutes in a vacuum environment to make Ni react with Si aggressively to thereby form an Ni silicide layer. Then, a Ti layer (thickness: 15000 Å) was formed by means of sputtering.

Also in this case, six peaks corresponding to Ti (102) face and Ti (112) face could be discriminated, so that the single crystal growth of the Ti layer was confirmed.

Sample 13

| Layer | Thickness |
| --- | --- |
| TiN | 10000 Å |
| Al treated thermally | 100 Å |
| Si substrate (111) | 300 μm |

An Al layer (thickness: about 100 Å) was evaporated onto a (111) face of an Si substrate at ordinary temperature. The substrate was heat-processed at 950° C. for 5 minutes in a vacuum environment. Then, a TiN layer (thickness: 10000 Å) was formed by means of sputtering.

Figure 19:
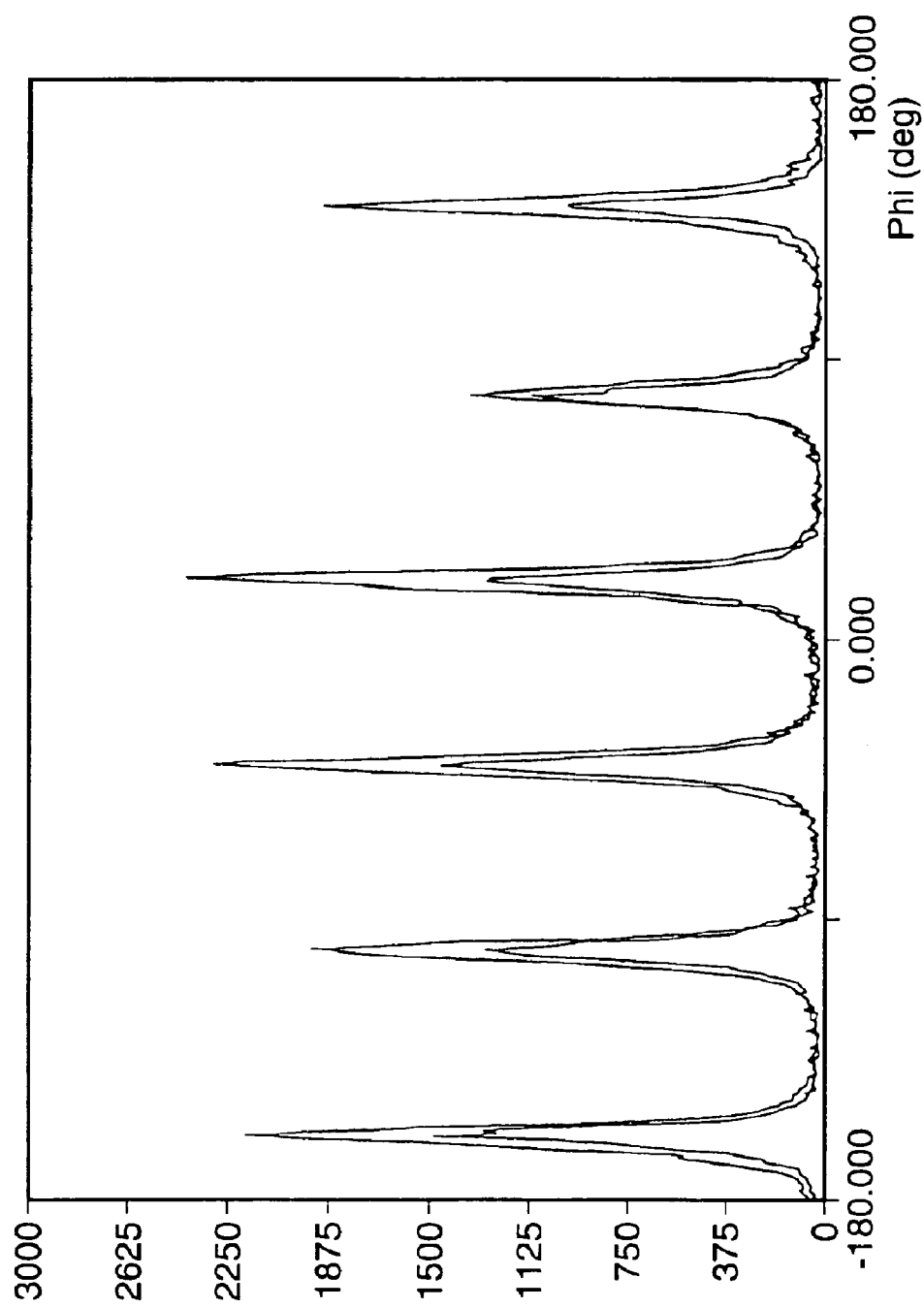
FIG. 19 shows a result of $\phi$(PHI) scanning of a sample 13.

FIG. 19 shows a result of φ(PHI) scanning to evaluate the crystallinity of the TiN layer (10000 Å). Peaks corresponding to TiN (200) face and TiN (220) face were confirmed. A TiN layer good in crystallinity was obtained.

Sample 14

| Layer | Thickness |
| --- | --- |
| TiN | 10000 Å |
| Ti silicide | 50 Å |
| Si substrate (111) | 300 μm |

A Ti layer (thickness: about 50 Å) was evaporated onto a (111) face of an Si substrate at ordinary temperature. The substrate was heated at 950° C. for 5 minutes in a vacuum environment to make Ti react with Si aggressively to thereby form a Ti silicide layer. Then, a TiN layer (thickness: 10000 Å) was formed by means of sputtering.

When φ(PHI) scanning was observed to evaluate the crystallinity of the TiN layer (10000 Å), six peaks were confirmed clearly. Hence, it was apparent that the TiN layer was grown as a single crystal.

Sample 15

| Layer | Thickness |
| --- | --- |
| TiN | 3000 Å |
| sapphire substrate face a | 300 μm |

Figure 20:
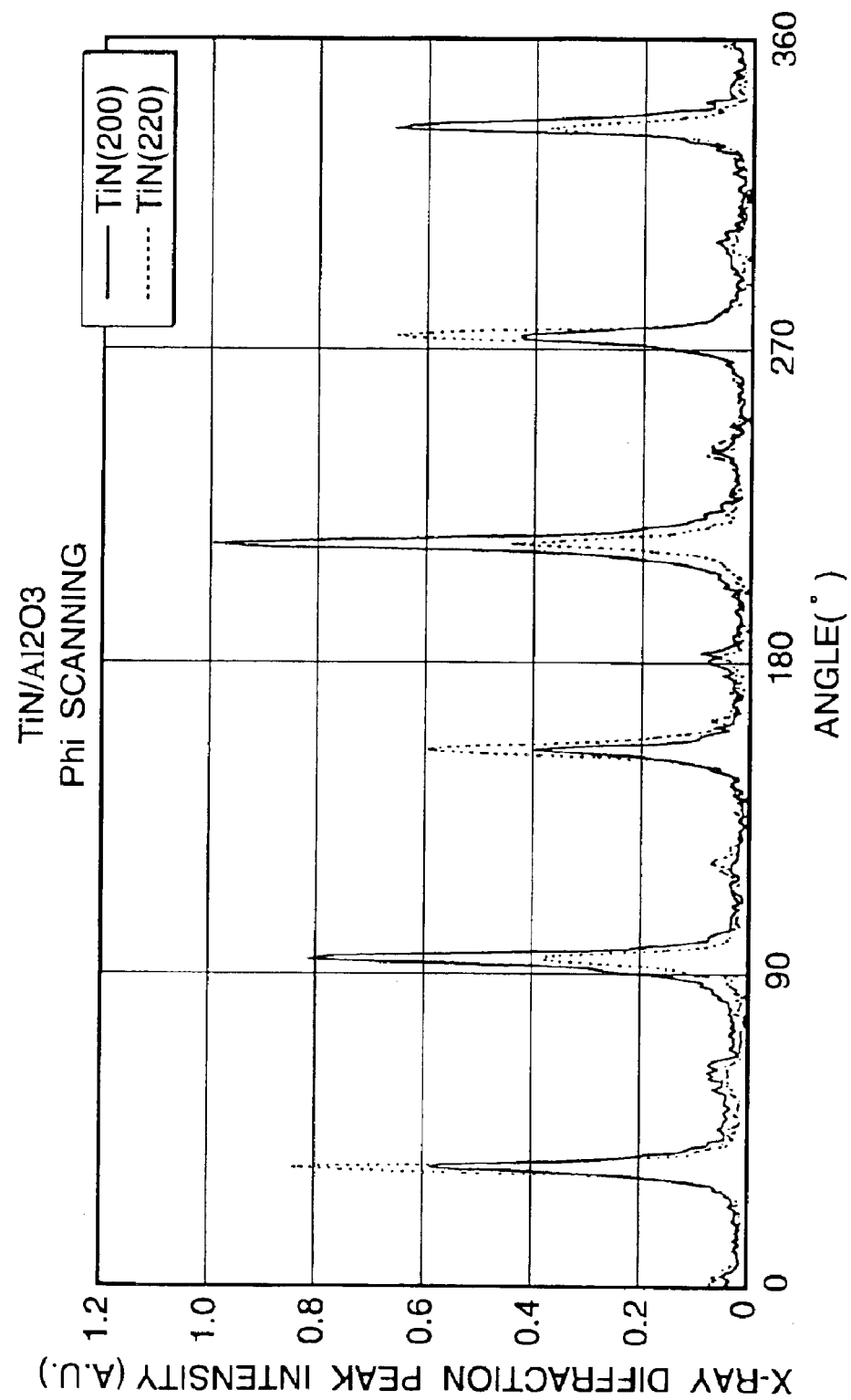
FIG. 20 shows a result of $\phi$(PHI) scanning of a sample 14.

TiN (3000 Å) was formed on a face a of a sapphire substrate by a reactive sputtering method. FIG. 20 shows a result of x-ray diffraction (φ(PHI) scanning) of the sample. It is apparent from the result shown in FIG. 20 that TiN of good crystallinity is formed also on the sapphire substrate. TiN of good crystallinity can be formed also on a face C of the sapphire substrate in the same manner as described above. When heating at 800° C. or higher is performed, the crystallinity of TiN is improved more greatly. Ti can be further formed on the TiN and a GaN semiconductor layer can be further formed on the Ti. A laminate of Ti/TiN may be repeated. In this case, the number of repetitions and the respective thicknesses of the layers are not particularly limited.

Sample 16

| Layer | Thickness |
|---|---|
| TiN | 3000 Å |
| GaN | 400 μm |
| AlN buffer layer | 160 Å |
| sapphire face a | 300 μm |

Figure 21:
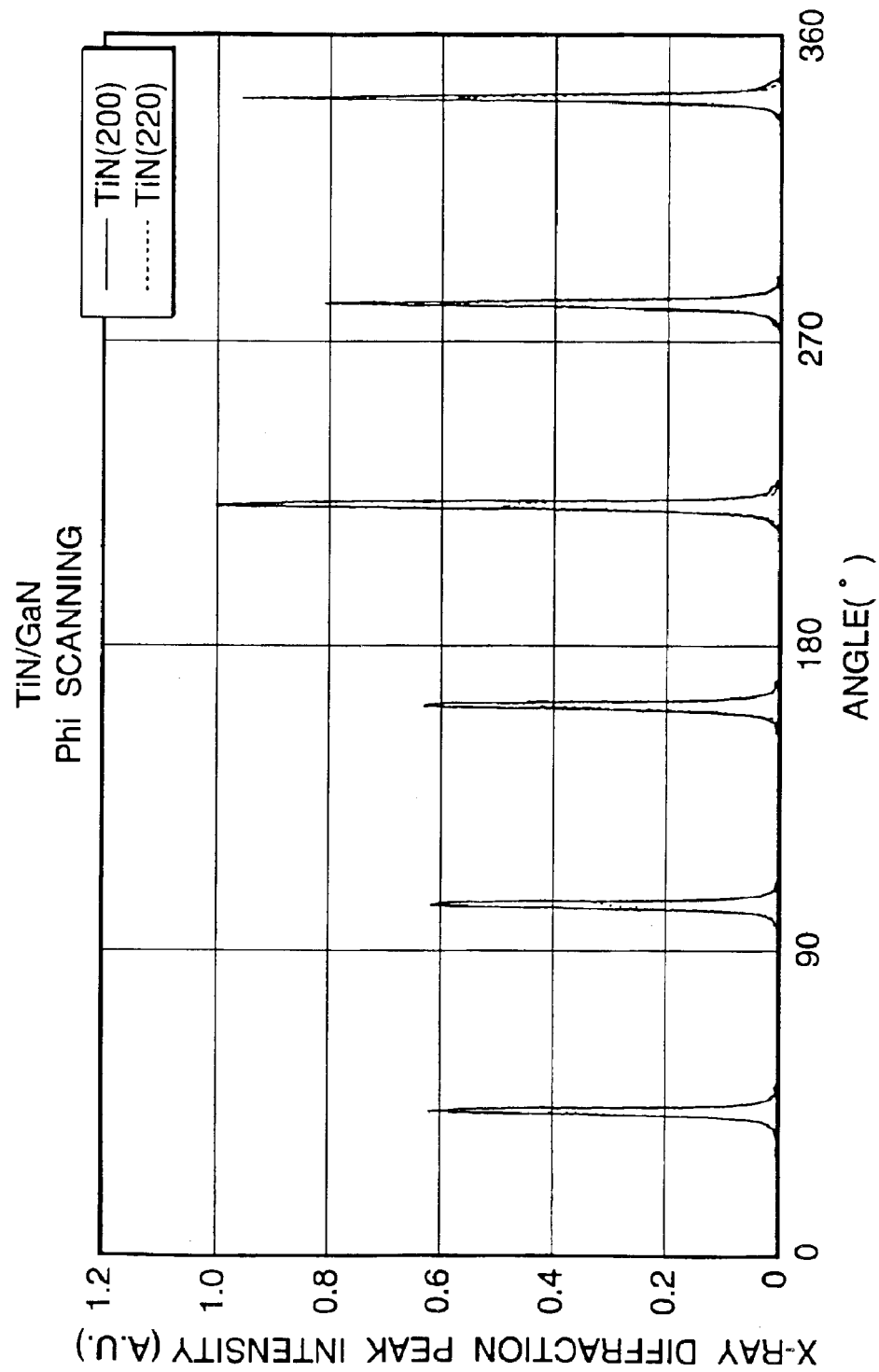
FIG. 21 shows a result of $\phi$(PHI) scanning of a sample 15.

TiN (3000 Å) was formed on GaN by a reactive sputtering method. FIG. 21 shows a result of X-ray diffraction (φ(PHI) scanning). It is apparent from the result shown in FIG. 21 that TiN of good crystallinity is formed also on GaN.

Sample 17

| Layer | Thickness |
|---|---|
| Ti | 15000 Å |
| TiN | 3000 Å |
| GaN | 400 μm |
| AlN buffer layer | 160 Å |
| sapphire face a | 300 μm |

Figure 22:
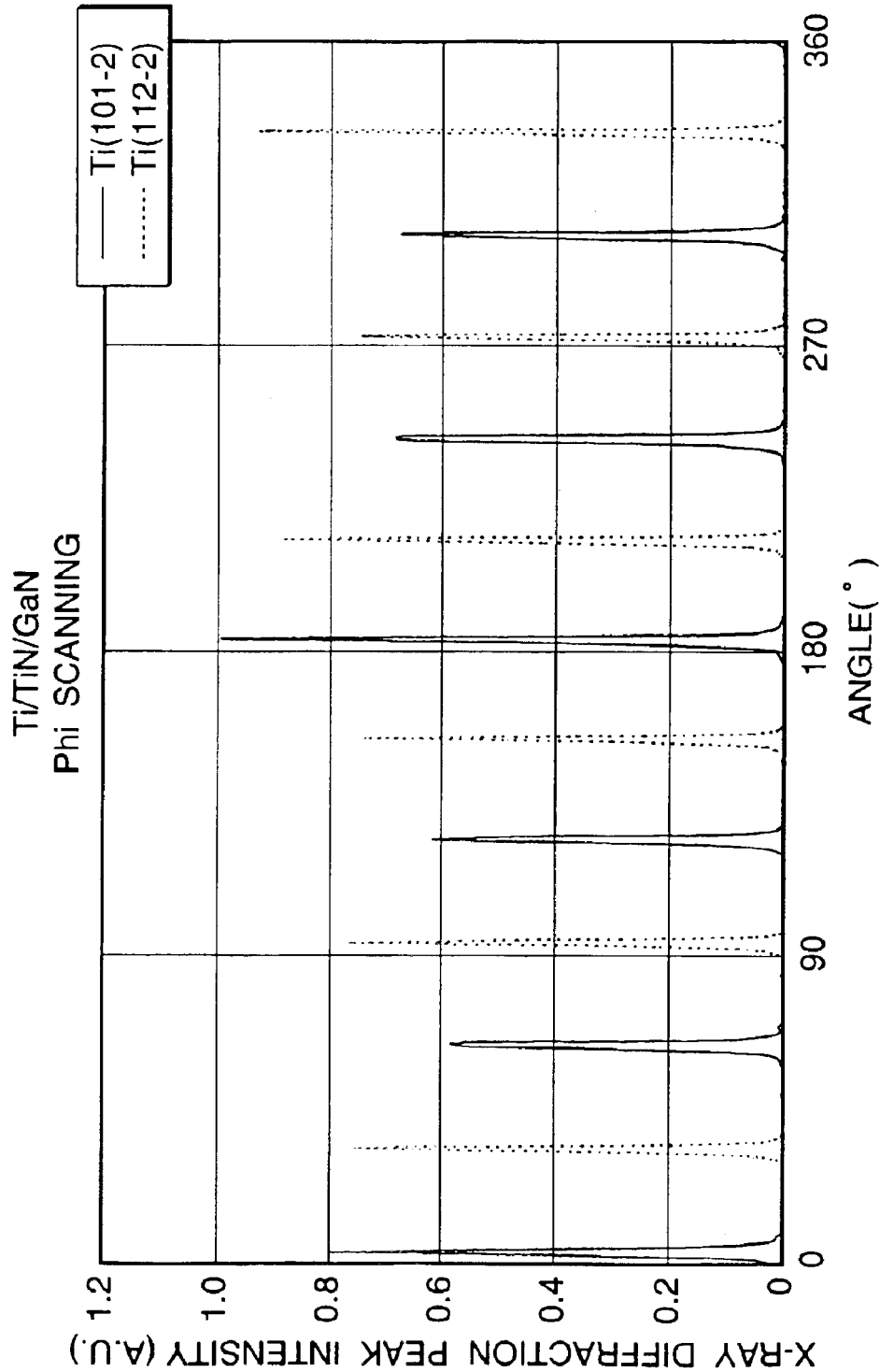
FIG. 22 shows a result of $\phi$(PHI) scanning of a sample 16.

Ti was further grown on TiN in the sample 16 (before heating) by a sputtering method. FIG. 22 shows a result of X-ray diffraction ((PHI) scanning). It is apparent from the result shown in FIG. 22 that the crystallinity of the Ti layer formed on TiN/GaN is good.

Embodiments of this invention will be described below.

(Fifth Embodiment)

Figure 23:
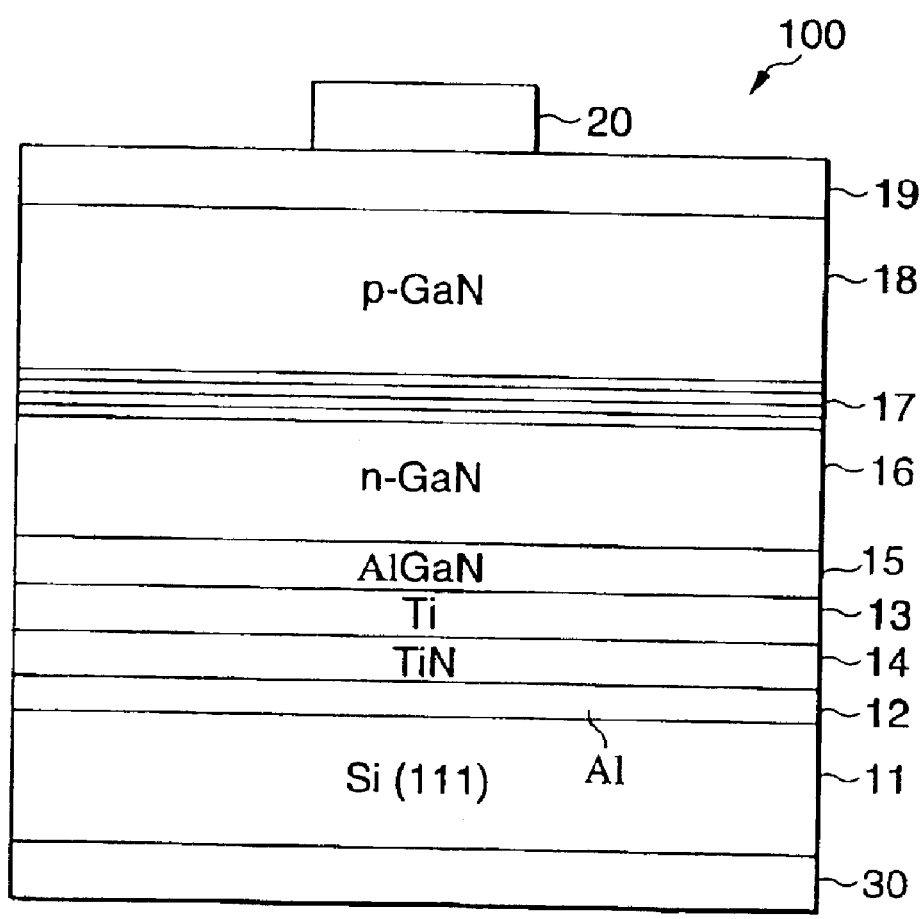
FIG. 23 shows the configuration of a light-emitting diode as a fifth embodiment.

This embodiment shows a light-emitting diode 100. FIG. 23 shows the configuration of the light-emitting diode 100.

Specifications of respective layers are as follows.

| Layer | Composition | Dopant | (Thickness) |
|---|---|---|---|
| p-type clad layer 18 | p-GaN | Mg | (0.3 μm) |
| Light-emitting layer 17 | Superlattice structure | | |
| quantum well layer | $In_{0.15}Ga_{0.85}N$ | | (35 Å) |
| barrier layer | GaN | | (35 Å) |
| the number of repeated quantum well and barrier layers: 1 to 10 | | | |
| n-type clad layer 16 | n-GaN | Si | (4 μm) |
| Buffer layer 15 | $Al_{0.9}Ga_{0.1}N$ | | (150 Å) |
| Ti layer 13 | Ti crystal | | (250 Å) |
| TiN layer 14 | TiN crystal | | (3000 Å) |
| Al layer 12 | Al | | (100 Å) |
| Substrate 11 | Si (111) | | (300 μm) |

The n-type clad layer 16 may be of a double-layered structure with an n⁻ layer of a low electron density on the light-emitting layer 17 side and an n⁺ layer of a high electron density on the buffer layer 15 side.

The light-emitting layer 17 is not limited to the superlattice structure but a single hetero type, a double hetero type, a homo-junction type, or the like, can be used as this layer.

An $Al_X In_Y Ga_{1-Y-X} N$ (inclusive of X=0, Y=0, X=Y=0) layer, which has a wide band gap and which is doped with an acceptor such as magnesium, or the like, may be interposed between the light-emitting layer 17 and the p-type clad layer 18. This technique is employed for preventing electrons implanted into the light-emitting layer 17 from being diffused into the p-type clad layer 18.

The p-type clad layer 18 may be of a double-layered structure with a p⁻ layer of a low hole density on the light-emitting layer 17 side and a p⁺ layer of a high hole density on the electrode side.

In the light-emitting diode 100 shown in this embodiment, the light-emitting structure of the Ti layer 13 and above is a known structure. Hence, a known method can be also employed as a method for forming the structure.

Detailed description will be made below.

The Al layer 12 formed on the Si (111) face is grown by a general evaporation method.

The TiN layer 14 and the Ti layer 13 are formed by a general reactive sputtering method.

Then, the Ti/TiN/Al/Si sample is transferred from a sputtering apparatus into a chamber of an MOCVD apparatus. The chamber is evacuated (to 2×10⁻³ Pa). In this state, the sample is heated to 650° C. and kept at 650° C. for 5 minutes.

Then, the buffer layer 15 of AlGaN is grown at a growth temperature of 350° C. In the condition that the temperature is further raised to 1000° C., the n-type clad layer 16 and layers following the n-type clad layer 16 are formed in accordance with an ordinary method (MOCVD method). In this growth method, an ammonia gas and gasses of group III metal alkyl compounds such as trimethylgallium (TMG), trimethylaluminum (TMA), and trimethylindium (TMI) are supplied to a substrate that has been heated to an appropriate temperature and are subjected to a thermal decomposition reaction to thereby grow a desired crystal on the substrate.

The crystallinity of the GaN semiconductor layer formed in this embodiment in the aforementioned manner is good.

A light-transmissible electrode 19, which is constituted by a thin film containing gold, is laminated to cover the substantially almost whole area of an upper face of the p-type clad layer 18. A p-type electrode 20, which is constituted also by a material containing gold, is formed on the light-transmissible electrode 19 by means of evaporation.

An n-type electrode 30 is formed on the substrate 11. A wire is bonded to a desired position. A light-emitting device made by this process has light intensity of 1 cd at 470 nm.

(Sixth Embodiment)

Figure 24:
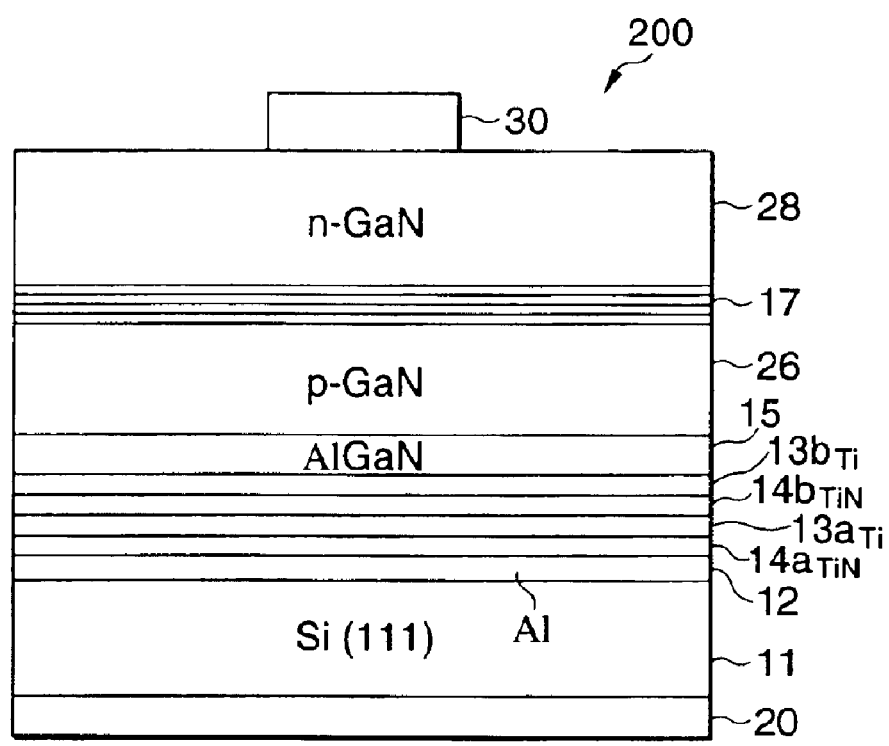
FIG. 24 shows the configuration of a light-emitting diode as a sixth embodiment.

FIG. 24 shows a semiconductor device as a sixth embodiment of this invention. The semiconductor device shown in this embodiment is a light-emitting diode 200. Incidentally, the same parts as shown in FIG. 23 are referred to by the same characters so that the description thereof will be omitted.

Specifications of respective layers are as follows.

| Layer | Composition | Dopant | (Thickness) |
|---|---|---|---|
| n-type clad layer 28 | n-GaN | Si | (0.3 μm) |
| light-emitting layer 17 | Superlattice structure | | |
| quantum well layer | $In_{0.15}Ga_{0.85}N$ | | (35 Å) |
| barrier layer | GaN | | (35 Å) |
| the number of repeated quantum well and barrier layers: 1 to 10 | | | |
| p-type clad layer 26 | p-GaN | Mg | (4 μm) |
| buffer layer 15 | $Al_{0.9}Ga_{0.1}N$ | | (150 Å) |
| Ti layer 13b | Ti crystal | | (250 Å) |
| TiN layer 14b | TiN crystal | | (100 Å) |
| Ti layer 13a | Ti crystal | | (250 Å) |
| TiN layer 14a | TiN crystal | | (100 Å) |
| Al layer 12 | Al | | (100 Å) |
| substrate 11 | Si (111) | | (300 μm) |

As described above, in this embodiment, laminates of Ti/TiN are formed repetitively. The number of repeated Ti/TiN laminates is not particularly limited. Also the thicknesses of the respective layers are not particularly limited but the thickness of each of the Ti layers is preferably set to be not larger than 250 Å from the point of view of securely preventing the layer from peeling.

The same producing method as in the fifth embodiment is applied to this embodiment.

In this embodiment, the p-type clad layer 26, the light-emitting layer 17 and the n-type clad layer 28 are grown successively on the buffer layer 15 to thereby form the light-emitting diode 200. In the case of the device 200, the light-transmissible electrode (see the reference character 19 in FIG. 23) can be omitted because the n-type clad layer 28 of low resistance forms the uppermost face.

In FIG. 24, the reference character 30 designates an n-type electrode formed on the Si substrate 11. The light-emitting device made by this process has a light intensity of about 1.2 cd at 470 nm.

The device to which the present invention is applied is not limited to the aforementioned light-emitting diode. For example, the prevent invention may be applied to optical devices such as a photodetector, a laser diode, etc. and also to electronic devices such as an FET structure, etc.

The prevent invention may be further applied to laminates which are intermediates of these devices.

This invention is not limited to the aforementioned description of the mode for carrying out the invention and the embodiments thereof at all, and includes various modifications that can be conceived by those skilled in the art without departing from the scope of claim for a patent.

The following items will be disclosed below.

(140) A laminate comprising:
a substrate made of Si;
a Ti layer formed on the substrate;
a GaN semiconductor layer formed on the Ti layer; and
a heat-resisting layer interposed between the substrate and the Ti layer to separate the substrate and the Ti layer from each other so that the substrate and the Ti layer are kept in a separate state at a temperature for the formation of the GaN semiconductor layer.

(141) A laminate according to the paragraph (140), wherein the heat-resisting layer is formed of any one of silicide, high-meting metal and metal nitride.

(142) A laminate according to the paragraph (141), wherein: the silicide is one member selected from the group consisting of Ti silicide, Co silicide, and Ni silicide; thermally treated Al; the high-meting metal is either Ta or Mo; and the metal nitride is one member selected from the group consisting of TiN, ZrN, HfN, and tantalum nitride.

(143) A laminate according to any one of the paragraphs (140) to (142), wherein the heat-resisting layer is formed on a (111) face of the substrate.

(144) A laminate according to any one of the paragraphs (140) to (143), wherein the Ti layer and the heat-resisting layer are laminated repetitively.

(145) A laminate according to the paragraph (144), wherein the thickness of each of the Ti layers is in a range of from 10 to 250 Å.

(146) A laminate comprising:
a substrate;
a layer formed on the substrate and constituted by repetition of a combination of a Ti layer and a heat-resisting layer; and
a GaN semiconductor layer formed on the repetition layer, wherein
the heat-resisting layer has a melting point substantially higher than the temperature for the formation of the GaN semiconductor layer.

(147) A laminate according to the paragraph (147), wherein the thickness of each of the Ti layers is in a range of from 10 to 250 Å.

The inventors have made further examination eagerly. As a result, the following invention has been conceived.

A group III nitride compound semiconductor device comprising:
a substrate;
an undercoat layer of electrically conductive metal nitride formed on the substrate; and
a group III nitride compound semiconductor layer formed on the undercoat layer, wherein
an electrode is provided on the undercoat layer.

According to the group III nitride compound semiconductor device configured as described above, not only the group III nitride compound semiconductor layer is formed on the undercoat layer made electrically conductive but also the electrode is provided on the undercoat layer. Hence, there is no necessity of providing a thick portion and a thin portion in the n-type layer as required in the background art. Hence, there is no concentration of current in the boundary between the thick and thin portions, so that the operating voltage of the device can be reduced.

In the above description, the material of the substrate is not particularly limited if the substrate is adapted to the group III nitride compound semiconductor. Sapphire, silicon, silicon carbide, zinc oxide, gallium phosphide, gallium arsenide, magnesium oxide, manganese oxide, etc. can be taken as examples of the material of the substrate.

This invention is particularly useful for electrically insulating substrates of sapphire, zinc oxide, etc.

Titanium nitride, hafnium nitride, zirconium nitride or tantalum nitride is selected as the electrically conductive metal nitride. The method for growing these metal nitrides on the substrate is not particularly limited but CVD (Chemical Vapor Deposition) such as MOCVD, plasma CVD, thermal CVD, optical CVD, etc., PVD (Physical Vapor Deposition) such as sputtering, reactive sputtering, laser ablation, ion plating, evaporation, ECR, etc., or the like, may be used as this method.

The thickness of the undercoat layer is preferably set to be in a range of from 0.3 to 10 $\mu$m. The reason why the thickness of the undercoat layer is set to be not smaller than 0.3 $\mu$m is that the undercoat layer is kept thick sufficiently to form the electrode on the undercoat layer even in the case where etching has influence on the undercoat layer when the group III nitride compound semiconductor layer is etched to reveal the undercoat layer. The reason why the thickness of the undercoat layer is set to be not larger than 10 $\mu$m is wholly an economic reason.

Another layer may be interposed between the undercoat layer and the substrate. According to the inventors' examination, titanium nitride is grown on a (111) face of silicon used as a substrate in the condition of a film-forming temperature of 500° C. or higher. When an Al layer is interposed between the (111) face and the titanium nitride layer, a single crystal film of titanium nitride can be formed even at a low temperature of about 300° C. The thickness of the Al layer is not particularly limited but is set to be about 100 Å. Also the method for forming the Al layer is not particularly limited but, for example, the Al layer may be formed by means of evaporation or sputtering, and so on.

After the undercoat layer is formed on the substrate, the substrate is preferably heated. The heating condition is a temperature of from 600 to 1200° C. (more preferably from 800 to 1200° C.) in a hydrogen gas or in a vacuum (more preferably in a hydrogen gas).

The group III nitride compound semiconductor is represented by the general formula $Al_XGa_YIn_{1-X-Y}N$ ($0 \leq X \leq 1$, $0 \leq Y \leq 1$, $0 \leq X+Y \leq 1$), which may further contain group III elements such as boron (B) and thallium (Tl) and in which the nitrogen (N) may be partially replaced by phosphorus (P), arsenic (As), antimony (Sb) or bismuth (Bi). The group III nitride compound semiconductor may contain an optional dopant.

The method for forming the group III nitride compound semiconductor layer is not particularly limited but, for example, this layer may be formed by a known metal organic chemical vapor deposition method. Alternatively, this layer may be formed by a known MBE method.

Another group III nitride compound semiconductor layer having a lattice constant substantially intermediate between the lattice constant of metal nitride constituting the undercoat layer and the lattice constant of the group III nitride compound semiconductor layer (generally represented by a GaN layer) constituting the device structure is preferably interposed as a buffer layer between the undercoat layer and the group III nitride compound semiconductor layer. This is for the purpose of relaxing the stress for lattice mismatch between the undercoat layer and the group III nitride compound semiconductor layer constituting the device structure.

When titanium nitride is selected as the undercoat layer to form a GaN clad layer of a light-emitting device on the undercoat layer, an AlN layer (about 150 Å) is preferably formed as a buffer layer on the titanium nitride layer. As a forming method, the undercoat layer is heated (1000° C., 5 minutes) in an atmosphere of hydrogen and then the group III nitride compound semiconductor layer is grown at about 1000° C. by an MOCVD method. Alternatively, the group III nitride compound semiconductor layer is grown on the undercoat layer of titanium nitride by a sputtering method without heating.

Preferably, AlN to be used as a buffer layer is doped with Si, or the like, to be provided as an n-type semiconductor.

After the group III nitride compound semiconductor layer is laminated, a predetermined portion of the layer is removed by means of etching so that the undercoat layer is revealed.

Alternatively, a predetermined portion of the undercoat layer may be covered with a mask in advance to prevent the group III nitride compound semiconductor layer from being grown on the portion of the undercoat layer so that the undercoat layer can be revealed by means of peeling the mask. Silicon oxide or silicon nitride is used as the material of the mask.

The position and shape of the revealed portion of the undercoat layer are not particularly limited but a circumferential edge portion of the undercoat layer is preferred from the point of view of the fact that the electrode must be formed thereon. When the shape of the device is square in plan view, that is, a corner portion of the undercoat layer is preferably revealed.

The material of the electrode connected to the undercoat layer is not particularly limited if ohmic contact can be obtained between the undercoat layer and the electrode. Taking wire-bonding into account, an Al, Au, an Au alloy, or the like, can be used as the material of the electrode.

A seventh embodiment of this invention will be described below with reference to the drawings.

Figure 25:
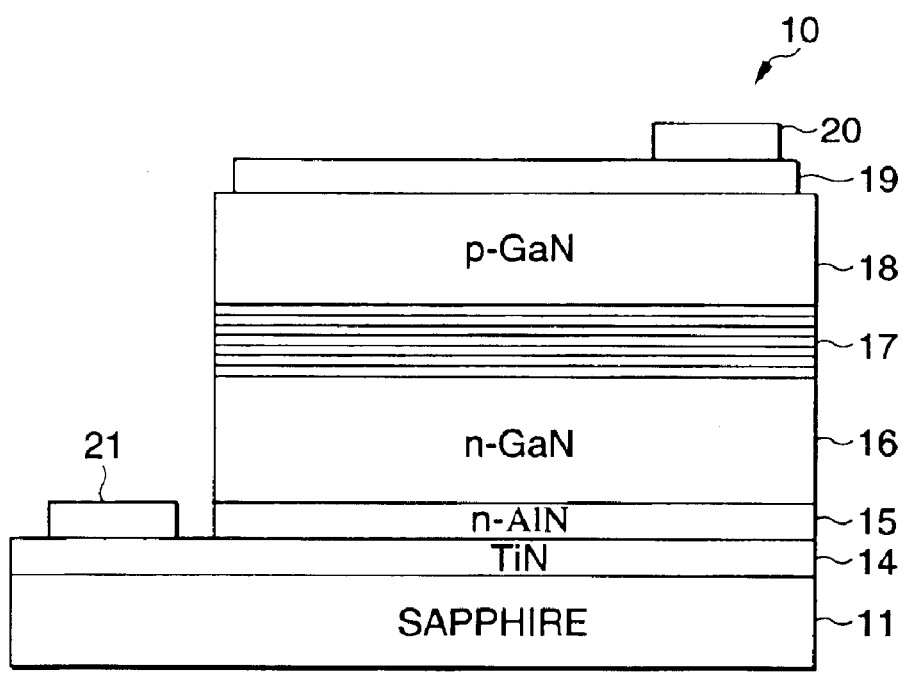
FIG. 25 is a sectional view showing a light-emitting diode as a seventh embodiment.
Figure 26:
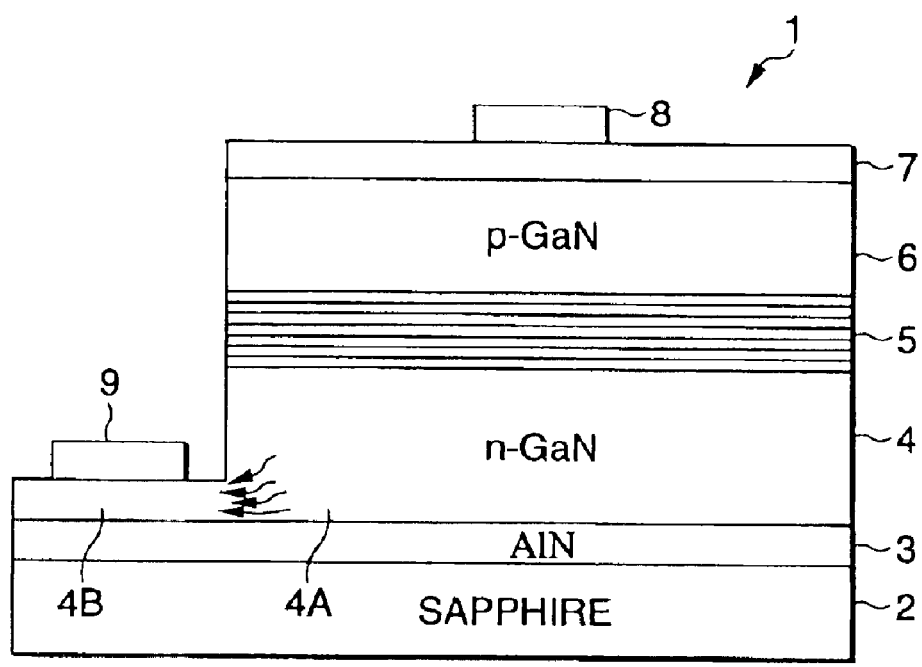
FIG. 26 is a sectional view showing a background-art light-emitting diode.

A light-emitting diode 10 shown in FIG. 25 will be taken as an example of the device.

Specifications of respective layers are as follows.

| Layer | Composition | Dopant | (Thickness) |
|---|---|---|---|
| p-type clad layer 18 | p-GaN | Mg | (0.3 μm) |
| Light-emitting layer 17 | Superlattice structure | | |

-continued

| Layer | Composition | Dopant | (Thickness) |
|---|---|---|---|
| quantum well layer | $In_{0.15}Ga_{0.85}N$ | | (35 Å) |
| barrier layer | GaN | | (35 Å) |
| the number of repeated quantum well and barrier layers: 1 to 10 | | | |
| n-type clad layer 16 | n-GaN | Si | (4 μm) |
| buffer layer 15 | n-AlN | Si | (150 Å) |
| TiN layer 14 (undercoat layer) | TiN single crystal | | (3000 Å) |
| substrate 11 | Sapphire | | (300 μm) |

In the above description, the buffer layer 15 is doped with an n-type dopant such as silicon, or the like, in order to secure the electrically conductive characteristic of the buffer layer 15.

The n-type clad layer 16 may be of a double-layered structure with an n⁻ layer of a low electron density on the light-emitting layer 17 side and an n⁺ layer of a high electron density on the buffer layer 15 side.

The light-emitting layer 17 is not limited to the superlattice structure but a single hetero type, a double hetero type, a homo-junction type, or the like, can be used as this layer.

An $Al_XGa_YIn_{1-X-Y}N$ ($0 \leq X \leq 1$, $0 \leq Y \leq 1$, $0 \leq X+Y \leq 1$) layer, which has a wide band gap and which is doped with an acceptor such as magnesium, or the like, may be interposed between the light-emitting layer 17 and the p-type clad layer 18. This technique is employed for preventing electrons implanted into the light-emitting layer 17 from being diffused into the p-type clad layer 18.

The p-type clad layer 18 may be of a double-layered structure with a p⁻ layer of a low hole density on the light-emitting layer 17 side and a p⁺ layer of a high hole density on the electrode side.

The TiN layer is formed by a general reactive sputtering method.

Then, the TiN/sapphire sample is transferred from a sputtering apparatus into a chamber of an MOCVD apparatus. While a hydrogen gas is made to flow into the chamber, the sample is heated to 1000° C. and kept at 1000° C. for 5 minutes.

Then, the buffer layer 15 of AlN is grown at a growth temperature of 1000° C. In the condition that the temperature is kept 1000° C., the n-type clad layer 16 and layers following the n-type clad layer 16 are formed in accordance with an ordinary method (MOCVD method). In this growth method, an ammonia gas and gasses of group III metal alkyl compounds such as trimethylgallium (TMG), trimethylaluminum (TMA), and trimethylindium (TMI) are supplied to a substrate that has been heated to an appropriate temperature and are subjected to a thermal decomposition reaction to thereby grow a desired crystal on the substrate.

Alternately, the respective group III nitride compound semiconductor layers may be formed by an MBE method.

After the respective group III nitride compound semiconductor layers are formed, the undercoat layer 14 of titanium nitride is revealed by means of etching.

Then, a light-transmissible electrode 19 is formed on the substantially whole face of the p-type clad layer 18 by means of evaporation. The light-transmissible electrode 19 is constituted by a thin film containing gold. A p-type electrode 20, which is constituted also by a material containing gold, is formed on the light-transmissible electrode 19 by means of evaporation.

Further, an n-type electrode 21 of an Au alloy is formed on the revealed portion of the undercoat layer 14 by means of evaporation.

According to the light-emitting diode configured as described above, the "current concentration" problem in the background art is solved because the n-type layer has a metallic conductivity. Further, metal nitride touching the electrodes is more excellent in terms of electric conduction than semiconductor. Hence, a low operating voltage can be achieved.

Further, metal nitride represented by titanium nitride generally has a metallic color. Hence, there is also an effect that light generated in the light-emitting layer toward the substrate is reflected by the metal nitride efficiently to thereby improve the brightness of the light-emitting diode.

Further, metal nitride represented by titanium nitride is generally high in heat conductivity. Hence, heat can be radiated efficiently from the revealed portion of the undercoat layer.

The group III nitride compound semiconductor layer formed on the undercoat layer may be provided as a p-type layer whereas the other group III nitride compound semiconductor layer, which is the uppermost layer, may be provided as an n-type layer. In this case, the light-transmissible electrode (seethe reference character 19 in FIG. 25) can be omitted.

The device to which the present invention is applied is not limited to the aforementioned light-emitting diode. The present invention may be applied also to optical devices such as a light-receiving diode, a laser diode, a solar cell, etc., bipolar devices such as a rectifier, a thyristor, a transistor, etc., unipolar devices such as an FET, etc., and electronic devices such as a microwave device, etc.

The present invention may be further applied to laminates which are intermediates of these devices.

This invention is not limited to the aforementioned description of the mode for carrying out the invention and embodiments thereof at all, and includes various modifications that can be conceived by those skilled in the art without departing from the scope of claim for a patent.

The following items will be disclosed.
(150) A laminate comprising:
   a substrate;
   an undercoat layer of electrically conductive metal nitride formed on the substrate; and
   a group III nitride compound semiconductor layer formed on a face of the undercoat layer, wherein
   the undercoat layer has a region which is a part of the face of the undercoat layer for the formation of the group III nitride compound semiconductor layer and which is not covered with the group III nitride compound semiconductor layer.
(151) A laminate according to the paragraph (150), wherein the metal nitride is constituted by at least one member selected from the group consisting of titanium nitride, zirconium nitride, hafnium nitride, and tantalum nitride.
(152) A laminate according to the paragraph (150) or (151), wherein: the shape of the device is square in plan view; and a portion put between two sides forming a corner portion of the square is the region which is not covered with the group III nitride compound semiconductor layer.
(153) A laminate according to any one of the paragraphs (150) to (152), wherein the region which is not covered with the group III nitride compound semiconductor layer is exposed.
(154) A method of producing a group III nitride compound semiconductor device, comprising the steps of:
   forming an undercoat layer of electrically conductive metal nitride on a substrate;
   forming a group III nitride compound semiconductor layer on the undercoat layer;
   removing the group III nitride compound semiconductor layer partially to reveal a part of the undercoat layer; and
   connecting an electrode to the revealed part of the undercoat layer.
(155) A producing method according to the paragraph (154), wherein the metal nitride is constituted by at least one member selected from the group consisting of titanium nitride, zirconium nitride, hafnium nitride, and tantalum nitride.
(156) A producing method according to the paragraph (154) or (155), wherein: the shape of device is square in plan view; the group III nitride compound semiconductor layer is formed on the whole area of the square device; and the group III nitride compound semiconductor layer is etched to reveal a corner portion of the right-angled quadrilateral to thereby reveal the corner portion of the undercoat layer.
(157) A method of producing a laminate, comprising the steps of:
   forming an undercoat layer of electrically conductive metal nitride on a substrate;
   forming a group III nitride compound semiconductor layer on the undercoat layer; and
   removing the group III nitride compound semiconductor layer partially to reveal a part of the undercoat layer.
(158) A producing method according to the paragraph (157), wherein the metal nitride is constituted by at least one member selected from the group consisting of titanium nitride, zirconium nitride, hafnium nitride, and tantalum nitride.
(159) A producing method according to the paragraph (157) or (158), wherein: the shape of the device is square in plan view; the group III nitride compound semiconductor layer is formed on the whole area of square device; and the group III nitride compound semiconductor layer is etched to reveal a corner portion of the right-angled quadrilateral to thereby reveal the corner portion of the undercoat layer.

What is claimed is:

1. A semiconductor device comprising:

a substrate;

an undercoat layer formed on said substrate and comprising a metal nitride; and a group III nitride compound semiconductor layer formed on said undercoat layer, and separated from said substrate by at least said undercoat layer, wherein said metal nitride comprises at least one of Nb, V, Y, and Cr.

2. A semiconductor device according to claim 1, wherein said metal nitride directly contacts said group III nitride compound semiconductor layer.

3. A semiconductor device according to claim 1, wherein said substrate comprises one member selected from the group consisting of sapphire, silicon carbide, gallium nitride, silicon, gallium phosphide, and gallium arsenide.

4. A semiconductor device according to claim 1, wherein said substrate comprises a cubic crystal material comprising a (111) face on which said undercoat layer is formed.

5. A semiconductor device according to claim 1, further comprising:

a first electrode provided on said undercoat layer.

6. A semiconductor device according to claim 1, wherein said undercoat layer is selected for providing a predetermined crystallinity of said group III nitride compound semiconductor layer.

7. A semiconductor device according to claim 1, wherein said undercoat layer has a thickness in a range of 0.1 to 10 $\mu$m.

8. A semiconductor device according to claim 1, further comprising:

a metal layer adjacent to said undercoat layer.

9. A semiconductor device according to claim 1, wherein said group III nitride compound semiconductor layer comprises a light-emitting layer.

10. A semiconductor device according to claim 9, wherein said undercoat layer reflects light emitted from said light-emitting layer.

11. A semiconductor device according to claim 1, wherein said undercoat layer comprises a continuously-formed undercoat layer.

* * * * *